(12) United States Patent
Jun et al.

(10) Patent No.: US 12,166,498 B2
(45) Date of Patent: Dec. 10, 2024

(54) ANALOG-TO-DIGITAL CONVERTING CIRCUIT USING OUTPUT VOLTAGE CLIPPING AND OPERATION METHOD THEREOF

(71) Applicant: SAMSUNG ELECTRONICS CO., LTD., Suwon-si (KR)

(72) Inventors: Jaehoon Jun, Suwon-si (KR); Beomsu Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 209 days.

(21) Appl. No.: 17/985,642

(22) Filed: Nov. 11, 2022

(65) Prior Publication Data

US 2023/0155602 A1 May 18, 2023

(30) Foreign Application Priority Data

Nov. 15, 2021 (KR) .................. 10-2021-0156707
May 16, 2022 (KR) .................. 10-2022-0059766

(51) Int. Cl.
*H03M 1/18* (2006.01)
*H03F 1/02* (2006.01)
*H03F 3/45* (2006.01)
*H03M 1/12* (2006.01)
*H03M 1/56* (2006.01)

(52) U.S. Cl.
CPC .......... *H03M 1/183* (2013.01); *H03F 1/0222* (2013.01); *H03F 3/45183* (2013.01); *H03M 1/1295* (2013.01); *H03M 1/56* (2013.01); *H03F 2203/45536* (2013.01)

(58) Field of Classification Search
CPC ...... H03M 1/183; H03M 1/1295; H03M 1/56; H03F 1/0222; H03F 2203/45536; H03F 3/45183
USPC ......................................... 341/155, 158, 169
See application file for complete search history.

(56) References Cited

U.S. PATENT DOCUMENTS

| | | | |
|---|---|---|---|
| 8,749,424 B2 | 6/2014 | Ueno | |
| 8,773,552 B2* | 7/2014 | Egawa | .............. H04N 25/75 348/297 |
| 9,787,926 B2 | 10/2017 | Yoshida | |
| 9,800,810 B2 | 10/2017 | Kikuchi et al. | |
| 9,942,497 B2 | 4/2018 | Ikeda et al. | |
| 10,313,617 B2 | 6/2019 | Kobuse | |
| 10,356,351 B1 | 7/2019 | Ebihara et al. | |
| 10,462,396 B2 | 10/2019 | Shouho et al. | |

(Continued)

*Primary Examiner* — Khai M Nguyen
(74) *Attorney, Agent, or Firm* — Sughrue Mion, PLLC

(57) ABSTRACT

In some embodiments, a circuit includes a first amplifier, a second amplifier, and a counter. The first amplifier operates based on a first power supply voltage and generates a first output signal by comparing a ramp signal and a reset signal of a pixel signal output from a pixel array during a first operation period and comparing the ramp signal and an image signal of the pixel signal output from the pixel array during a second operation period. The second amplifier operates based on the first power supply voltage, generates a second output signal based on the first output signal and adjust a voltage level of the second output signal from a low level to a third level. The counter operates based on a second power supply voltage, counts pulses of the second output signal, and outputs a counting result as a digital signal.

20 Claims, 20 Drawing Sheets

(56) References Cited

U.S. PATENT DOCUMENTS

2019/0116331 A1\* 4/2019 Jung ................... H04N 25/78
2021/0176419 A1 6/2021 Lee et al.

\* cited by examiner

ANALOG-TO-DIGITAL CONVERTING CIRCUIT USING OUTPUT VOLTAGE CLIPPING AND OPERATION METHOD THEREOF

CROSS-REFERENCE TO RELATED APPLICATIONS

This application claims priority under 35 U.S.C. § 119 to Korean Patent Application No. 10-2021-0156707, filed on Nov. 15, 2021, and to Korean Patent Application No. 10-2022-0059766, filed on May 16, 2022, in the Korean Intellectual Property Office, the disclosures of which are incorporated by reference herein in their entireties.

BACKGROUND

1. Field

The present disclosure relates to an analog-to-digital converter, and more particularly, to an analog-to-digital converting circuit using output voltage clipping and an operation method thereof.

2. Description of Related Art

An image sensor may include a charge coupled device (CCD) image sensor, a complementary metal-oxide semiconductor (CMOS) image sensor (CIS), etc. The CMOS image sensor may include pixels composed of CMOS transistors and may convert light energy into an electrical signal by using a photoelectric conversion element (or device) included in each pixel. The CMOS image sensor may obtain information about a captured/photographed image by using the electrical signal generated by each pixel.

An analog-to-digital converter (ADC) may receive an analog input voltage and may convert the received analog input voltage to a digital signal. The converted digital signal may be provided to other devices. The ADC may be used in various signal processing devices. As the performance of signal processing devices is improved, an improved resolution for an analog signal may be required. As such, an ADC capable of processing many signals within the same time or providing an improved resolution for each signal may be used. However, such an ADC may cause an increase in power consumption.

SUMMARY

Embodiments of the present disclosure provide an analog-to-digital converting circuit capable of reducing power consumption by using output voltage clipping and an operation method thereof.

According to an aspect of the present disclosure, a circuit is provided. The circuit includes a first amplifier, a second amplifier, and a counter. The first amplifier is configured to operate based on a first power supply voltage and to generate a first output signal by comparing a ramp signal and a reset signal of a pixel signal output from a pixel array during a first operation period and comparing the ramp signal and an image signal of the pixel signal output from the pixel array during a second operation period. The second amplifier is configured to operate based on the first power supply voltage and to generate a second output signal based on the first output signal. The counter is configured to operate based on a second power supply voltage, to count pulses of the second output signal, and to output a counting result as a digital signal. The first level of the first power supply voltage is greater than a second level of the second power supply voltage. The second amplifier is further configured to adjust a voltage level of the second output signal from a low level to a third level. The third level is less than or equal to the second level of the second power supply voltage.

In some embodiments, the second amplifier may include a first transistor configured to provide the first power supply voltage to a first output node, from which the second output signal is output, in response to the first output signal. In such embodiments, the second amplifier may further include a clipping circuit coupled between a power supply voltage terminal and the first transistor, and configured to adjust the voltage level of the second output signal by causing a voltage drop between the power supply voltage terminal and the first transistor. In such embodiments, the second amplifier may further include a current source coupled with the first transistor through the first output node, and configured to generate a power current.

In some embodiments, the clipping circuit may further include a second transistor and a third transistor. A drain terminal of the second transistor may be coupled to a gate terminal of the second transistor. A drain terminal of the third transistor is coupled to a gate terminal of the third transistor.

In some embodiments, the clipping circuit may further include a switch coupled between the drain terminal of the second transistor and a source terminal of the third transistor.

In some embodiments, the clipping circuit may further include a switch coupled between the drain terminal and a source terminal of the third transistor.

In some embodiments, the clipping circuit may further include a switch coupled with the gate terminal of the third transistor. The third transistor may operate in response to an enable signal applied to the gate terminal of the third transistor.

In some embodiments, the clipping circuit may further include a first switch coupled with the gate terminal of the second transistor, and a second switch coupled with the gate terminal of the third transistor. The second transistor may operate in response to a first enable signal applied to the gate terminal of the second transistor. The third transistor may operate in response to a second enable signal applied to the gate terminal of the third transistor.

In some embodiments, the clipping circuit may further include a resistor coupled between the power supply voltage terminal and the first transistor.

In some embodiments, the second amplifier may further include a control circuit configured to output a control current in response to a control signal. In such embodiments, the control circuit may include a second transistor configured to generate the control current based on the first power supply voltage, in response to the control signal, and a third transistor configured to provide the control current to the first output node in response to a bias signal.

In some embodiments, the control circuit may be further configured, during the first operation period or the second operation period, when the ramp signal starts to ramp down, to output the control current to the current source through the first output node.

According to an aspect of the present disclosure, a circuit is provided. The circuit includes a first amplifier, a second amplifier, and a counter. The first amplifier is configured to operate based on a first power supply voltage and to generate a first output signal by equalizing voltage levels of input nodes and output nodes in response to a first auto-zero signal in a first auto-zero period, comparing a ramp signal and a reset signal of a pixel signal output from a pixel array in a first operation period, and comparing the ramp signal and an image signal of the pixel signal output from the pixel array in a second operation period. The second amplifier is configured to operate based on the first power supply voltage, to charge a capacitor in response to a second auto-zero signal in a second auto-zero period, and to generate a second output signal based on the first output signal. The counter is configured to operate based on a second power supply voltage, to count pulses of the second output signal, and to output a counting result as a digital signal. A first level of the first power supply voltage is greater than a second level of the second power supply voltage. The second amplifier is further configured to adjust a voltage level of the second output signal from a low level to a third level. The third level is less than or equal to the second level of the second power supply voltage. During at least one of the first operation period and the second operation period, the second output signal controls a power current of the second amplifier. An operation of the second amplifier is stopped from a first time at which the second auto-zero period ends to a second time at which the first operation period starts.

In some embodiments, the second amplifier further includes a first transistor, a clipping circuit, a second transistor, a third transistor, a current source, a feedback circuit, and a fourth transistor. The first transistor is configured to provide the first power supply voltage to a first output node, from which the second output signal is output, in response to the first output signal. The clipping circuit is coupled between a power supply voltage terminal and the first transistor, and configured to adjust the voltage level of the second output signal by causing a voltage drop between the power supply voltage terminal and the first transistor. The second transistor is coupled with the capacitor through a bias node, and configured to be turned on in response to the second auto-zero signal. The third transistor is configured to be turned off in response to a power down signal such that the operation of the second amplifier is stopped. The current source is coupled with the first transistor through the first output node, coupled with the capacitor and the second transistor through the bias node, and configured to generate the power current based on a voltage level of the bias node, which is maintained by the capacitor. The feedback circuit is coupled with the clipping circuit, and configured to receive a signal, which is based on the second output signal, and to output a feedback signal for controlling the power current. The fourth transistor coupled with the current source through a second output node, and configured to connect the first output node and the second output node in response to the feedback signal.

In some embodiments, the clipping circuit includes a fifth transistor and a sixth transistor. A drain terminal of the fifth transistor is coupled to a gate terminal of the fifth transistor. A drain terminal of the sixth transistor is coupled to a gate terminal of the sixth transistor.

In some embodiments, the feedback circuit includes a logic gate coupled with a third output node between the fifth transistor and the sixth transistor, and configured to output the feedback signal based on a voltage level of the third output node and a feedback enable signal. The fourth transistor is turned off in response to the feedback signal.

In some embodiments, the logic gate includes a NAND gate.

In some embodiments, the power down signal is activated when the second auto-zero period ends and is deactivated when the first operation period starts.

According to an aspect of the present disclosure, a circuit is provided. The circuit operates a first power supply voltage and generates an output signal in an operation period. The circuit includes a first transistor, and a current source. The first transistor is configured to provide a power supply voltage to a first output node from which the output signal is output. The clipping circuit is coupled between a power supply voltage terminal and the first transistor, and configured to adjust a voltage level of the output signal to be lower than a level of the first power supply voltage, by making a voltage drop between the power supply voltage terminal and the first transistor. The current source is coupled with the first transistor through the first output node, and configured to generate a power current.

In some embodiments, the clipping circuit includes a second transistor and a third transistor. A drain terminal of the second transistor is coupled to a gate terminal of the second transistor. A drain terminal of the third transistor is coupled to a gate terminal of the third transistor.

In some embodiments, the first transistor is a positive metal-oxide semiconductor (PMOS) transistor, and the second transistor and the third transistor are negative metal-oxide semiconductor (NMOS) transistors.

In some embodiments, the first transistor, the second transistor, and the third transistor are positive metal-oxide semiconductor (PMOS) transistors.

According to an aspect of the present disclosure, an operation method of an analog-to-digital converting circuit is provided. The method includes comparing a pixel signal output from a pixel array with a ramp signal to generate a first output signal. The method further includes generating a second output signal based on the first output signal. The method further includes clipping a voltage level of the second output signal. The method further includes counting pulses of the second output signal and outputting a counting result as a digital signal.

In some embodiments, the generating of the first output signal and the generating of the second output signal are performed based on a first power supply voltage, the outputting of the counting result as the digital signal is performed based on a second power supply voltage lower than the first power supply voltage, and the clipping of the voltage level of the second output signal includes increasing the voltage level of the second output signal from a low level to a third level. The third level is less than or equal to a level of the second power supply voltage.

BRIEF DESCRIPTION OF THE DRAWINGS

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure.

In the detailed description, components described with reference to the terms "unit", "module", "block", "~er" or "~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
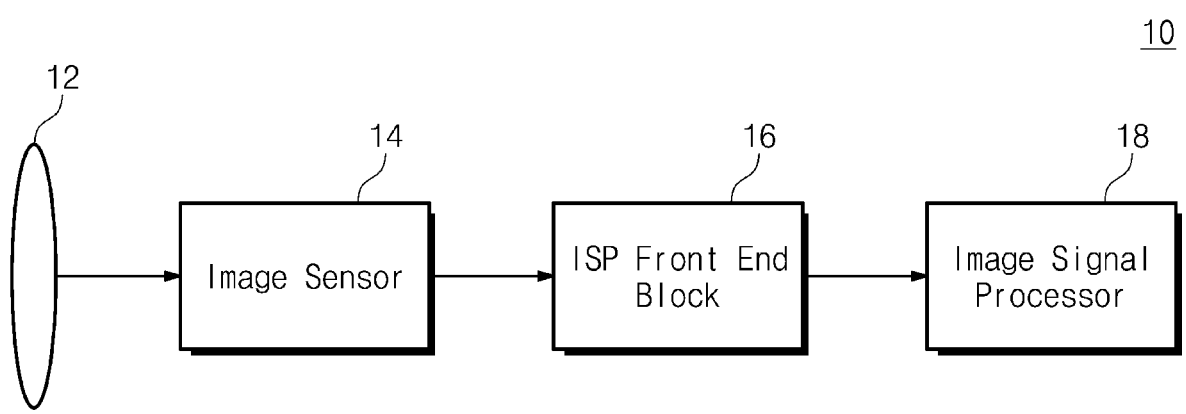
FIG. 1 illustrates an example of a configuration of an image processing block according to an embodiment of the present disclosure.

FIG. 1 illustrates an example of a configuration of an image processing block 10 according to an embodiment of the present disclosure. The image processing block 10 may be implemented as a part of various electronic devices such as a smartphone, a digital camera, a laptop computer, and a desktop computer. The image processing block 10 may include a lens 12, an image sensor 14, an image signal processor (ISP) front end block 16, and an image signal processor 18.

A light may be reflected by an object, a scenery, etc. targeted for photographing, for example, and the lens 12 may receive the reflected light. The image sensor 14 may generate an electrical signal based on the light received through the lens 12. For example, the image sensor 14 may be implemented with a complementary metal-oxide semiconductor (CMOS) image sensor or the like. For example, the image sensor 14 may be a multi-pixel image sensor having a dual pixel structure or a tetracell structure.

The image sensor 14 may include a pixel array. Pixels of the pixel array may convert a light into electrical signals and may generate pixel values. In addition, the image sensor 14 may include an analog-to-digital converting (ADC) circuit for performing correlated double sampling (CDS) on the pixel values. A configuration of the image sensor 14 is described in detail with reference to FIG. 2.

The ISP front end block 16 may perform pre-processing on an electrical signal output from the image sensor 14 so as to be appropriate for processing of the image signal processor 18.

The image signal processor 18 may generate image data associated with the photographed object and scenery by appropriately processing the electrical signal processed by the ISP front end block 16. To this end, the image signal processor 18 may perform various processing such as color interpolation, color correction, auto white balance, gamma correction, color saturation correction, formatting, bad pixel correction, and hue correction.

One lens 12 and one image sensor 14 are illustrated in FIG. 1. However, in another embodiment, the image processing block 10 may include a plurality of lenses, a plurality of image sensors, and/or a plurality of ISP front end blocks. In this case, the plurality of lenses may have different fields of view. Alternatively or additionally, the plurality of image sensors may have different functions, different performances, and/or different characteristics, and may respectively include pixel arrays of different configurations.

Figure 2:
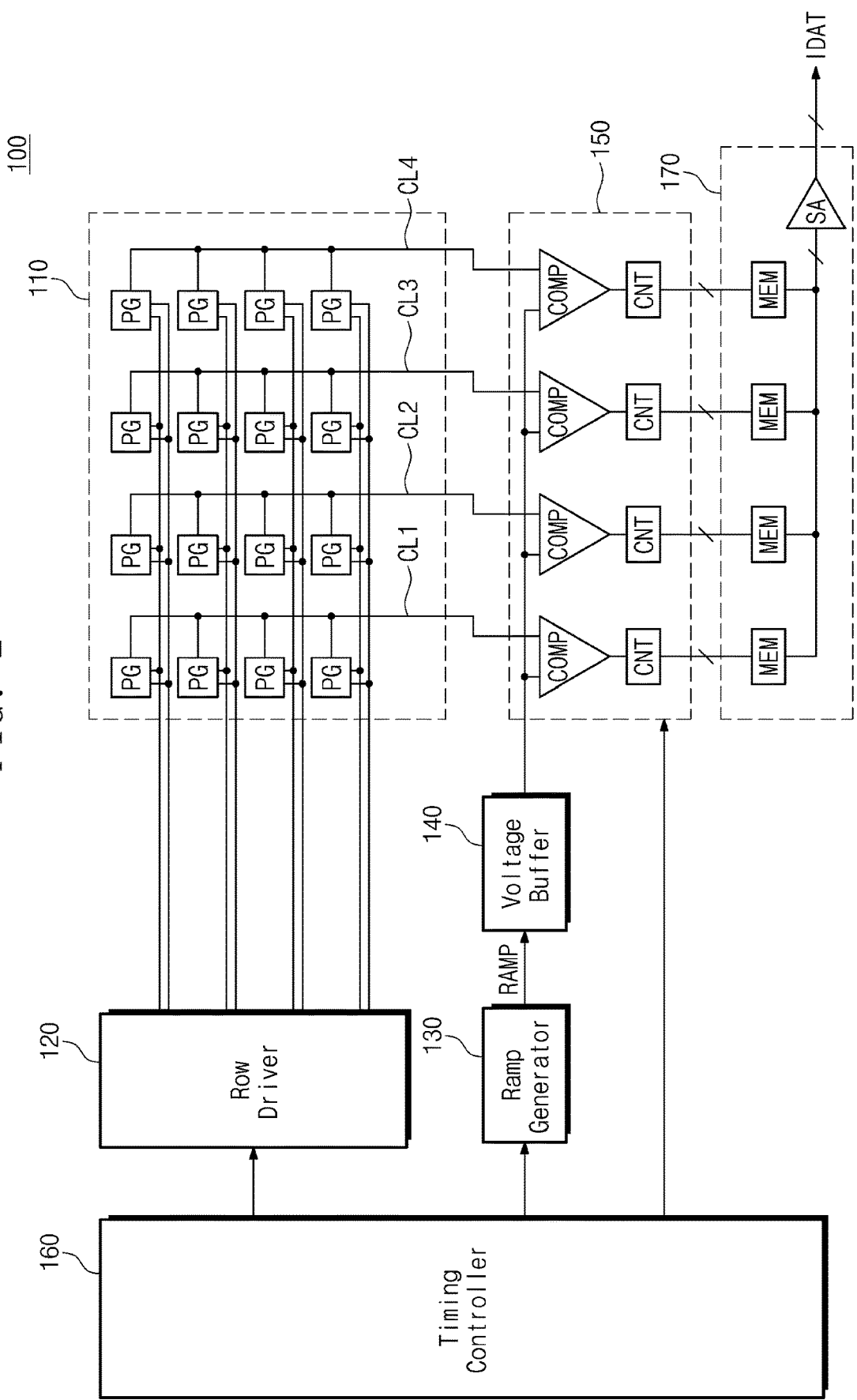
FIG. 2 illustrates an example of a configuration of an image sensor of FIG. 1.

FIG. 2 illustrates an example of a configuration of the image sensor 14 of FIG. 1. An image sensor 100 may include or may be similar in many respects to the image sensor 14 described above with reference to FIG. 1, and may include additional features not mentioned above. The image sensor 100 may include a pixel array 110, a row driver 120, a ramp signal generator 130, a voltage buffer 140, an ADC circuit 150, a timing controller 160, and a buffer 170.

The pixel array 110 may include a plurality of pixels arranged in the form of a matrix, that is, arranged along rows and columns. Each of the plurality of pixels may include a photoelectric conversion element (or device). For example, the photoelectric conversion element may include a photo diode, a photo transistor, a photo gate, a pinned photo diode, or the like.

The pixel array 110 may include a plurality of pixel groups PG. Each pixel group PG may include two or more pixels, that is, a plurality of pixels. A plurality of pixels constituting a pixel group PG may share one floating diffusion region or a plurality of floating diffusion regions. An example in which the pixel array 110 includes the pixel groups PG arranged in the form of a matrix with four rows and four columns (e.g., includes 4×4 pixel groups PG) is illustrated in FIG. 2. However, the present disclosure is not limited thereto.

The pixel group PG may include pixels of the same color. For example, the pixel group PG may include a red pixel to convert a light of a red spectrum into an electrical signal, a green pixel to convert a light of a green spectrum into an electrical signal, or a blue pixel to convert a light of a blue spectrum into an electrical signal. For example, the pixels constituting the pixel array 110 may be arranged in the form of a tetra-Bayer pattern.

The pixels of the pixel array 110 may output pixel signals through column lines CL1 to CL4, depending on the intensity or the amount of light received from the outside. For example, the pixel signal may be an analog signal corresponding to the intensity or the amount of light received from the outside. The pixel signals may pass through voltage buffers (e.g., source followers) and may then be provided to the ADC circuit 150 through the column lines CL1 to CL4.

The row driver 120 may select and drive a row of the pixel array 110. The row driver 120 may decode an address and/or a control signal generated by the timing controller 160 and may generate control signals for selecting and driving a row of the pixel array 110. For example, the control signals may include a signal for selecting a pixel, a signal for resetting a floating diffusion region, etc.

The ramp signal generator 130 may generate a ramp signal RAMP under control of the timing controller 160. For example, the ramp signal generator 130 may operate in response to a control signal such as a ramp enable signal. When the ramp enable signal is activated, the ramp signal generator 130 may generate the ramp signal RAMP depending on preset values (e.g., a start level, an end level, and a slope). That is, the ramp signal RAMP may be a signal that increases or decreases along a preset slope during a specific time. The ramp signal RAMP may be provided to the ADC circuit 150 through the voltage buffer 140.

The ADC circuit 150 may receive pixel signals from a plurality of pixels of the pixel array 110 through the column lines CL1 to CL4, and may receive the ramp signal RAMP from the ramp signal generator 130 through the voltage buffer 140. The ADC circuit 150 may operate based on a correlated double sampling (CDS) technique for obtaining a reset signal and an image signal from the received pixel signal and extracting a difference between the reset signal and the image signal as an effective signal component. The ADC circuit 150 may include a plurality of comparators COMP and a plurality of counters CNT.

In detail, each of the comparators COMP may compare the reset signal of the pixel signal and the ramp signal RAMP, may compare the image signal of the pixel signal and the ramp signal RAMP, and may perform correlated double sampling (CDS) on comparison results. Each of the counters CNT may count pulses of the signal experiencing the correlated double sampling and may output a counting result as a digital signal. Alternatively or additionally, the ADC circuit 150 of the present disclosure may be implemented to reduce power consumption by using output voltage clipping, auto-zero period optimizing, and/or output feedback. For example, the comparators COMP may include clipping circuits for performing the output voltage clipping. An example in which the ADC circuit 150 includes four comparators COMP and four counters CNT is illustrated in FIG. 2, but the present disclosure is not limited thereto.

The timing controller 160 may generate a control signal and/or a clock for controlling an operation and/or a timing of each of the row driver 120, the ramp signal generator 130, and the ADC circuit 150.

The buffer 170 may include memories MEMs and a sense amplifier SA. The memories MEM may store digital signals output from the corresponding counters CNT of the ADC circuit 150. The sense amplifiers SA may sense and amplify the digital signals stored in the memories MEMs. The sense amplifier SA may output the amplified digital signals as image data IDAT, and the image data IDAT may be provided to the ISP front end block 16 of FIG. 1.

Figure 3:
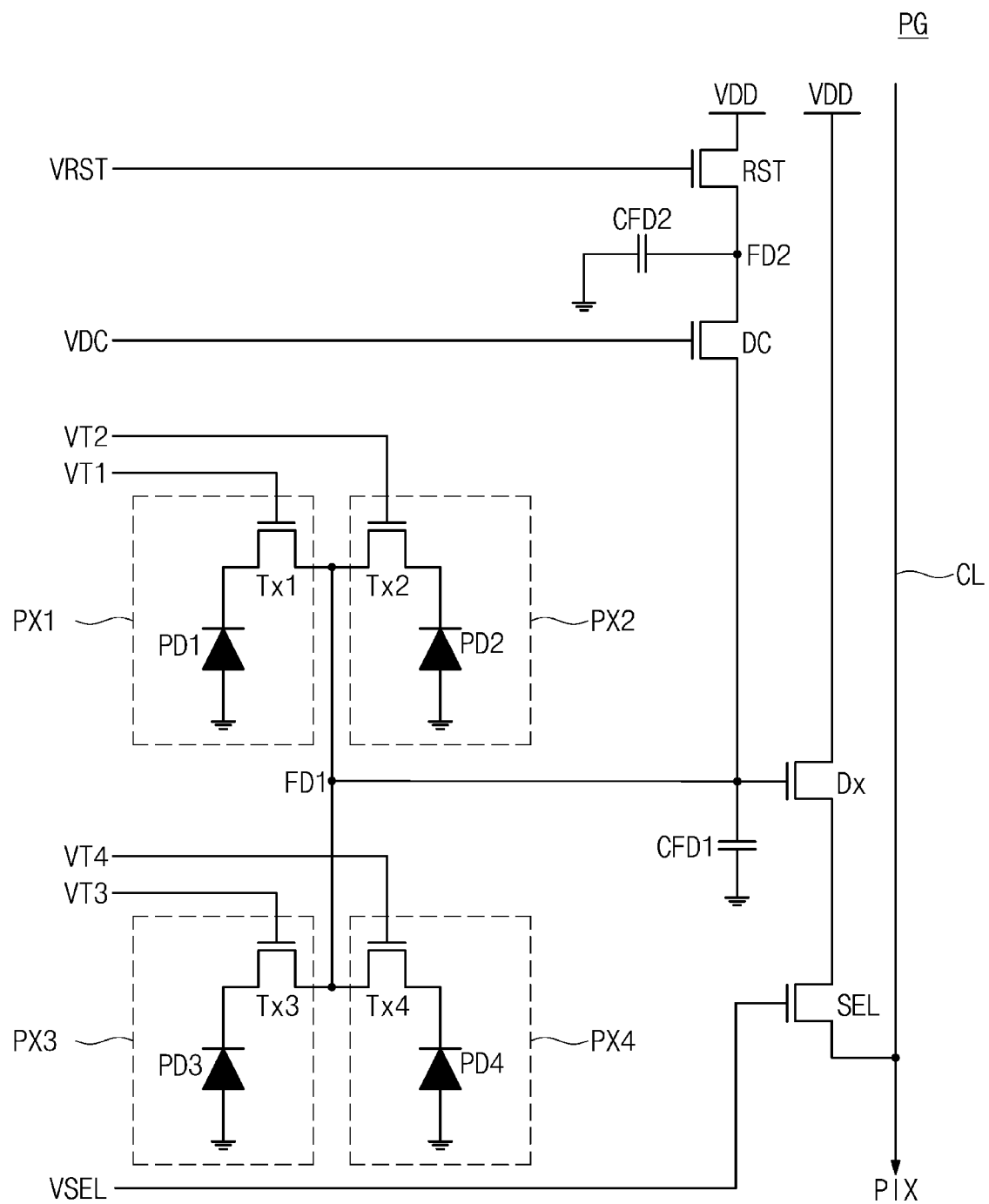
FIG. 3 is a circuit diagram illustrating an example of one among pixel groups of a pixel array of FIG. 2.

FIG. 3 is a circuit diagram illustrating an example of one of the pixel groups PG of the pixel array 110 of FIG. 2. For example, the pixel group PG may include pixels PX1 to PX4, photoelectric conversion elements PD1 to PD4, transfer transistors Tx1 to Tx4, a reset transistor RST, a dual conversion transistor DC, a drive transistor Dx, and a select transistor SEL. An example in which the pixel group PG has a tetracell structure in which four pixels PX1 to PX4 respectively include photoelectric conversion elements PD1 to PD4 is illustrated in FIG. 3, but the present disclosure is not limited thereto. For example, the pixel group PG may be implemented to have various different structures.

The first pixel PX1 may include the first photoelectric conversion element PD1 and the first transfer transistor Tx1, and each of the remaining pixels PX2, PX3, and PX4 may also include similar components/elements. The pixels PX1 to PX4 may share the reset transistor RST, the dual conversion transistor DC, the drive transistor Dx, and the select transistor SEL. Alternatively or additionally, the pixels PX1 to PX4 may share a first floating diffusion region FD1.

The first floating diffusion region FD1 or a second floating diffusion region FD2 may accumulate (or integrate) charges corresponding to the amount of incident light. While the transfer transistors Tx1 to Tx4 are respectively turned on by transfer signals VT1 to VT4, the first floating diffusion region FD1 or the second floating diffusion region FD2 may accumulate (or integrate) charges supplied from the photoelectric conversion elements PD1 to PD4. Because the first floating diffusion region FD1 is connected with a gate terminal of the drive transistor Dx operating as a source follower amplifier, a voltage corresponding to the charges accumulated at the first floating diffusion region FD1 may be formed. For example, a capacitance of the first floating diffusion region FD1 is depicted as a first capacitance CFD1.

The dual conversion transistor DC may be driven by a dual conversion signal VDC. When the dual conversion transistor DC is turned off, the capacitance of the first floating diffusion region FD1 may correspond to the first capacitance CFD1. In a general environment, because the first floating diffusion region FD1 is not easily saturated, there is no need to increase the capacitance (e.g., CFD1) of the first floating diffusion region FD1. In this case, the dual conversion transistor DC may be turned off.

However, in a high-illuminance environment, the first floating diffusion region FD1 may be easily saturated. To prevent the saturation, the dual conversion transistor DC may be turned on such that the first floating diffusion region FD1 and the second floating diffusion region FD2 are electrically connected. In this case, a capacitance of the floating diffusion regions FD1 and FD2 may be increased to a sum of the first capacitance CFD1 and a second capacitance CFD2.

The transfer transistors Tx1 to Tx4 may be respectively driven by the transfer signals VT1 to VT4, and may transfer charges generated (or integrated) by the photoelectric conversion elements PD1 to PD4 to the first floating diffusion region FD1 or the second floating diffusion region FD2. For example, first ends of the transfer transistors Tx1 to Tx4 may be respectively connected with the photoelectric conversion elements PD1 to PD4, and second ends thereof may be connected in common with the first floating diffusion region FD1.

The reset transistor RST may be driven by a reset signal VRST and may provide a power supply voltage VDD to the first floating diffusion region FD1 or the second floating diffusion region FD2. As such, the charges accumulated in the first floating diffusion region FD1 or the second floating diffusion region FD2 may move to a terminal for the power supply voltage VDD, and a voltage of the first floating diffusion region FD1 or the second floating diffusion region FD2 may be reset.

The drive transistor Dx may amplify a voltage of the first floating diffusion region FD1 or the second floating diffusion region FD2 and may generate a pixel signal PIX corresponding to a result of the amplification. The select transistor SEL may be driven by a selection signal VSEL and may select pixels to be read in units of row. When the select transistor SEL is turned on, the pixel signal PIX may be output to the ADC circuit 150 of FIG. 2 through a column line CL.

Figure 4:
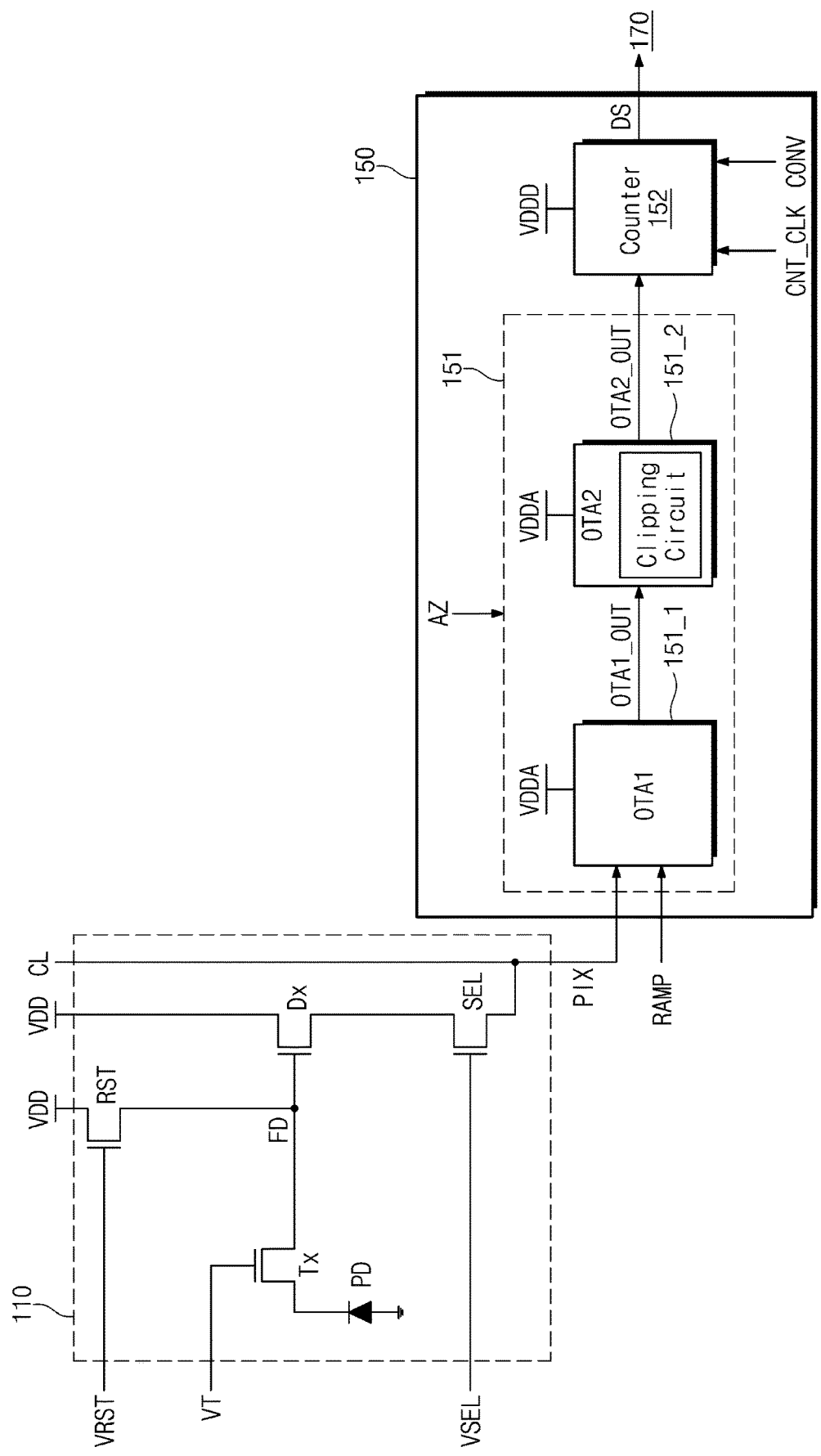
FIG. 4 illustrates an example of a configuration of an analog-to-digital converting circuit of FIG. 2.

FIG. 4 illustrates an example of a configuration of the analog-to-digital converting (ADC) circuit 150 of FIG. 2. The ADC circuit 150 may include a comparator 151 and a counter 152. The ADC circuit 150 may convert and output the pixel signal PIX being an analog signal output from the pixel array 110 into a digital signal DS. For the clearness of description and the brevity of drawing, an example in which the pixel array 110 includes only one pixel is illustrated in FIG. 4, and the configuration and function of the pixel array 110 are identical to those described with reference to FIG. 3. Alternatively or additionally, the ADC circuit 150 may include a plurality of comparators and a plurality of counters, but one comparator 151 and one counter 152 are illustrated in FIG. 4 for the clearness of description.

In detail, as described with reference to FIG. 2, the comparator 151 may compare the reset signal of the pixel signal and the ramp signal RAMP, may compare the image signal of the pixel signal and the ramp signal RAMP, and may perform correlated double sampling (CDS) on comparison results, and the counter 152 may count pulses of a signal experiencing the correlated double sampling (CDS) and may output a counting result as a digital signal. FIG. 4 is described with reference to FIGS. 2 and 3.

For example, the comparator 151 may have a two-stage structure including two amplifiers (e.g., a first amplifier 151_1 and a second amplifier 151_2), and each of the first amplifier 151_1 and the second amplifier 151_2 may be implemented as an operational transconductance amplifier (OTA). However, the present disclosure is not limited thereto. For example, the comparator 151 may have a structure including more amplifiers. The first amplifier 151_1 and the second amplifier 151_2 may operate based on an analog input voltage VDDA.

The first amplifier 151_1 may receive the pixel signal PIX from the pixel array 110 through the column line CL, and may receive the ramp signal RAMP from the ramp signal generator 130 through the voltage buffer 140. The first amplifier 151_1 may output a first output signal OTA1_OUT based on the received signals. For example, in a period where a level of the ramp signal RAMP is higher than a level of the pixel signal PIX, the first amplifier 151_1 may output the first output signal OTA1_OUT having a high level. In a period where the level of the ramp signal RAMP is lower than the level of the pixel signal PIX, the first amplifier 151_1 may output the first output signal OTA1_OUT having a low level. Alternatively or additionally, the comparison operation of the first amplifier 151_1 described above may be performed both when the reset signal of the pixel signal PIX and the ramp signal RAMP are compared and when the image signal of the pixel signal PIX and the ramp signal RAMP are compared.

The second amplifier 151_2 may amplify the first output signal OTA1_OUT and may output a second output signal OTA2_OUT being a comparison signal. For example, the second output signal OTA2_OUT may be an inverted version of the first output signal OTA1_OUT. That is, the second amplifier 151_2 may output the second output signal OTA2_OUT having the low level during the high level of the first output signal OTA1_OUT and may output the second output signal OTA2_OUT having the high level during the low level of the first output signal OTA1_OUT. In general, the voltage level of the second output signal OTA2_OUT may reach the level of the analog input voltage VDDA.

In the following description, that a voltage level of the first output signal OTA1_OUT or the second output signal OTA2_OUT transitions from the high level to the low level or from the low level to the high level as the comparator 151 performs the comparison operation may be referred to as a "decision of the ADC circuit 150". That is, "after the decision of the circuit 150 ends" may mean "after a voltage level of the first output signal OTA1_OUT or the second output signal OTA2_OUT changes from the high level to the low level or from the low level to the high level". In an auto-zero period before the comparison operation is performed, the comparator 151 may be initialized in response to an auto-zero signal AZ and may then again perform the comparison operation.

The counter 152 may operate under control of the timing controller 160, may count pulses of the second output signal OTA2_OUT, and may output a counting result as the digital signal DS. For example, the counter 152 may operate in response to control signals such as a counter clock signal CNT_CLK and an inversion signal CONV for inverting an internal bit of the counter 152. Alternatively or additionally, the counter 152 may operate based on a digital input voltage VDDD.

For example, the counter 152 may include an up/down counter, a bit-wise inversion counter, etc. An operation of the bit-wise inversion counter may be similar to an operation of the up/down counter. For example, the bit-wise inversion counter may perform a function of performing up-counting only and a function of converting all internal bits of a counter to obtain the 1's complement when a specific signal is input thereto. The bit-wise inversion counter may perform a reset count, and may then invert a reset counting result so as to be converted into the 1's complement, that is, a negative value.

Alternatively or additionally, under the condition that the counter 152 operates based on the digital input voltage VDDD and the second amplifier 151_2 operates based on the analog input voltage VDDA, for the counter 152 to count pulses of the second output signal OTA2_OUT from the second amplifier 151_2, the voltage level of the second output signal OTA2_OUT may be adjusted to belong to a range of the digital input voltage VDDD. In general, because the level of the analog input voltage VDDA is set to be higher than the level of the digital input voltage VDDD, the counter 152 may be implemented to include a component (e.g., a level down shifter) for stepping down the voltage level of the second output signal OTA2_OUT reaching the level of the analog input voltage VDDA to the level of the digital input voltage VDDD.

As such, the component for shifting the voltage level of the second output signal OTA2_OUT may cause an increase in the area (or size) of the counter 152. And, as a result, the parasitic capacitance of the ADC circuit 150 may increase.

To possibly prevent the above issues, when the decision of the ADC circuit 150 is made, the second amplifier 151_2 of the present disclosure may perform clipping on the second output signal OTA2_OUT such that the voltage level of the second output signal OTA2_OUT increases only to a level that is equal to or smaller than the level of the digital input voltage VDDD, instead of increasing the voltage level of the second output signal OTA2_OUT from the low level to the level of the analog input voltage VDDA. To clip the output voltage, the second amplifier 151_2 may include a clipping circuit.

Through the output voltage clipping operation of the second amplifier 151_2, a separate component (e.g., a level down shifter) for shifting the voltage level of the second output signal OTA2_OUT may not be required. Accordingly, the area (or size) of the counter 152 may decrease, and the parasitic capacitance of the ADC circuit 150 may also decrease. In addition, the phenomenon that pulses of the second output signal OTA2_OUT are not counted may be prevented, and the power consumption of the ADC circuit 150 may decrease. The output voltage clipping operation of the second amplifier 151_2 according to an embodiment of the present disclosure is described in detail with reference to FIG. 6.

Figure 5:
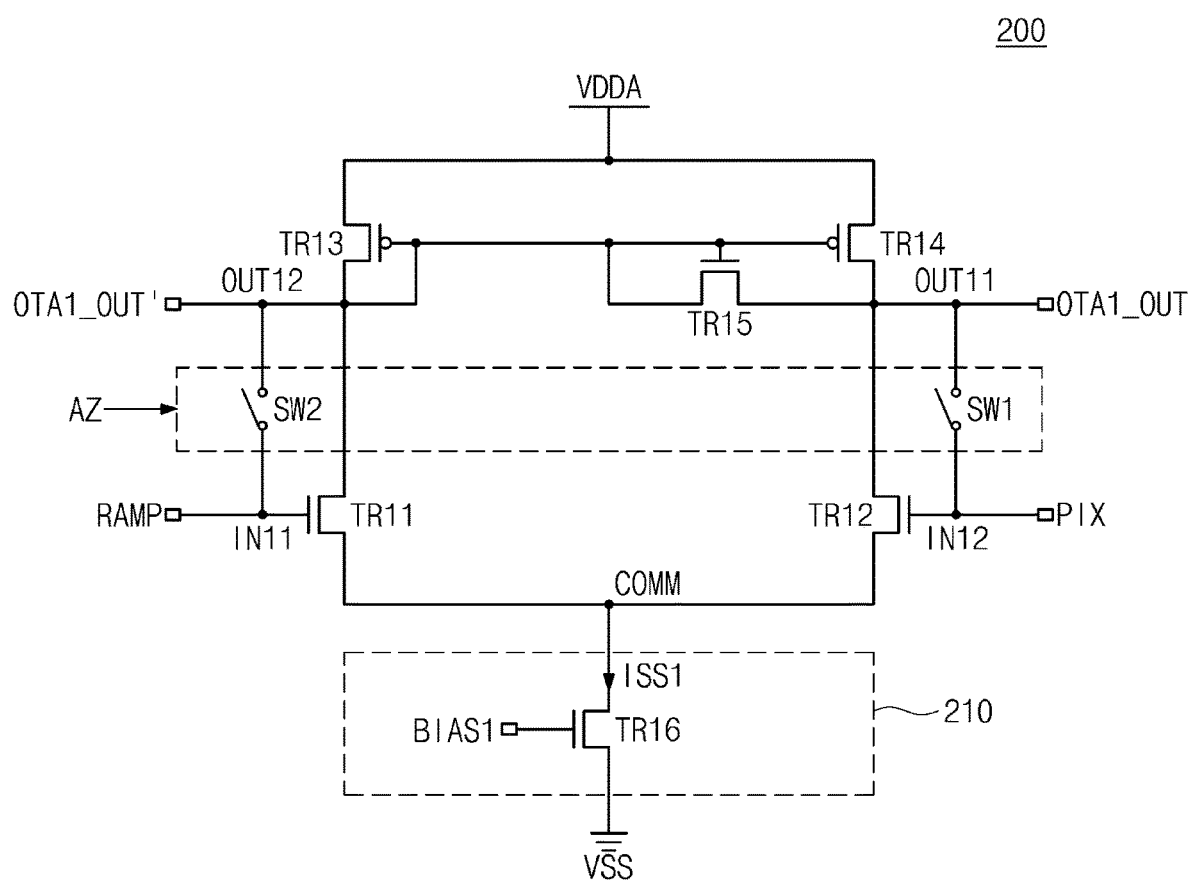
FIG. 5 is a circuit diagram illustrating an example of a first amplifier of FIG. 4.

FIG. 5 is a circuit diagram illustrating an example of the first amplifier 151_1 of FIG. 4. A first amplifier 200 may include or may be similar in many respects to the first amplifier 151_1 described above with reference to FIG. 4, and may include additional features not mentioned above. The first amplifier 200 may include a plurality of transistors TR11 to TR16, a plurality of switches SW1 and SW2, and a first current source 210. For example, the first transistor TR11, the second transistor TR12, the fifth transistor TR15, and the sixth transistor TR16 may be negative metal-oxide semiconductor (NMOS) transistors, and the third transistor TR13 and the fourth transistor TR14 may be positive metal-oxide semiconductor (PMOS) transistors. However, the present disclosure is not limited thereto. The first to sixth transistors TR11 to TR16 may be implemented with transistors whose types are different from those illustrated in FIG. 5.

Referring to FIG. 5, the ramp signal RAMP may be input to a gate terminal of the first transistor TR11, and the pixel signal PIX may be input to a gate terminal of the second transistor TR12. Source terminals of the first and second transistors TR11 and TR12 may be connected with the first current source 210 at a common node COMM. For example, the third and fourth transistors TR13 and TR14 may be connected in the form of a current mirror. A sum of currents flowing to the first and second transistors TR11 and TR12 may be equal to a first power current ISS1.

A gate terminal and a drain terminal of the third transistor TR13 and a drain terminal of the first transistor TR11 may be connected in common with a second output node OUT12, and a drain terminal of the fourth transistor TR14 and a drain terminal of the second transistor TR12 may be connected in common with a first output node OUT11. The fifth transistor TR15 may be connected between the first and second output nodes OUT11 and OUT12. For example, the fifth transistor TR15 may limit a voltage level of a signal that is output from the first output node OUT11.

The first output signal OTA1_OUT may be output from the first output node OUT11, and an inverted first output signal OTA1_OUT' may be output from the second output node OUT12. For example, in a period where a level of the ramp signal RAMP is higher than a level of the pixel signal PIX, the first output signal OTA1_OUT may have the high level. In a period where the level of the ramp signal RAMP is lower than the level of the pixel signal PIX, the first output signal OTA1_OUT may have the low level. The first output signal OTA1_OUT may be provided to the second amplifier 151_2 of FIG. 4.

The first current source 210 may include the sixth transistor TR16. The sixth transistor TR16 may be connected with a ground voltage VSS and may generate the first power current ISS1 based on a first bias signal BIAS1.

During the auto-zero period, the switches SW1 and SW2 may be turned on in response to an auto-zero signal AZ. When the switches SW1 and SW2 are turned on, a second input node IN12 and the first output node OUT11 may be connected with each other, and a first input node IN11 and the second output node OUT12 may be connected with each other. Accordingly, during the auto-zero period, voltage levels of the first input node IN11, the second input node IN12, the first output node OUT11, and the second output node OUT12 may be equalized.

Figure 6:
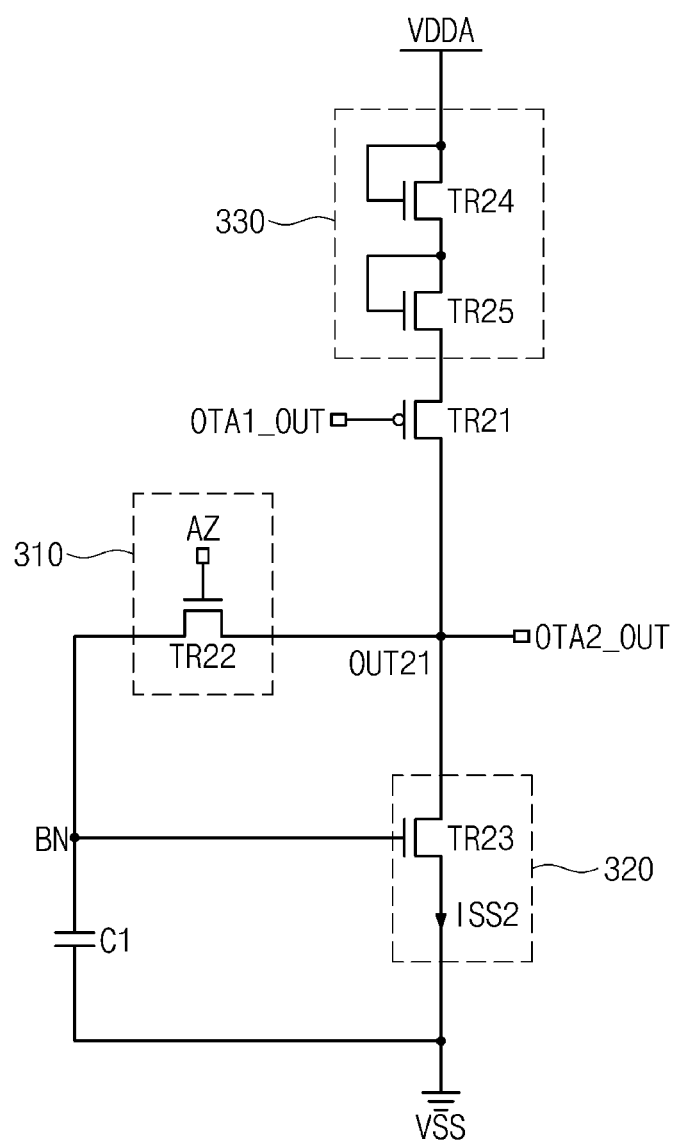
FIG. 6 is a circuit diagram illustrating an example of a second amplifier of FIG. 4.

FIG. 6 is a circuit diagram illustrating an example of the second amplifier 151_2 of FIG. 4. A second amplifier 300 may include or may be similar in many respects to the second amplifier 151_2 described above with reference to FIG. 4, and may include additional features not mentioned above. The second amplifier 300 may include a plurality of transistors TR21 to TR25, a capacitor C1, a switching circuit 310, a current source 320, and a clipping circuit 330. For example, the seventh transistor TR21 may be a PMOS transistor, and the eighth to eleventh transistors TR22 to TR25 may be NMOS transistors. However, the present disclosure is not limited thereto. The seventh to eleventh transistors TR21 to TR25 may be implemented with transistors whose types are different from those illustrated in FIG. 7.

The seventh transistor TR21 may receive the first output signal OTA1_OUT from the first amplifier 151_1 of FIG. 4 as an input, and may operate in response to the first output signal OTA1_OUT. In example, the second amplifier 300 may operate as an inversion amplifier. In detail, when the voltage level of the first output signal OTA1_OUT is the high level, the seventh transistor TR21 may be turned off. In this case, because a current does not flow to a third output node OUT21, the voltage level of the second output signal OTA2_OUT may be the low level. In contrast, when the voltage level of the first output signal OTA1_OUT is the low level, the seventh transistor TR21 may be turned on. In this case, because a current flows to the third output node OUT21, the voltage level of the second output signal OTA2_OUT may increase. In general, the voltage level of the second output signal OTA2_OUT may reach the level of the analog input voltage VDDA, but the second output signal OTA2_OUT of the present disclosure may be implemented to increase only to a level that is equal to or smaller than the level of the digital input voltage VDDD by an operation of the clipping circuit 330.

The switching circuit 310 may include the eighth transistor TR22 connected between the third output node OUT21 and a bias node BN. During the auto-zero period, the eighth transistor TR22 may operate in response to the auto-zero signal AZ, and may be turned on when the auto-zero signal AZ is activated. When the eighth transistor TR22 is turned on, the voltage level of the bias node BN and the voltage level of the third output node OUT21 may be equalized, and charges may be charged in the capacitor C1 connected with the bias node BN.

In contrast, in the case where the eighth transistor TR22 is turned off as the auto-zero signal AZ is deactivated during the comparison operation of the ADC circuit 150 of FIG. 4, the voltage level of the bias node BN, which is equal to the voltage level of the third output node OUT21, may be maintained by the capacitor C1, and thus, the current source 320 may operate.

The current source 320 may include the ninth transistor TR23 connected with the third output node OUT21. The ninth transistor TR23 may generate a power current ISS2 based on the voltage of the bias node BN, that is, the voltage of one end of the capacitor C1.

The clipping circuit 330 may include the tenth transistor TR24 and the eleventh transistor TR25 connected between a power supply voltage (e.g., the analog input voltage) VDDA and the seventh transistor TR21. A gate terminal and a drain terminal of each of the tenth transistor TR24 and the eleventh transistor TR25 may be connected with each other. That is, the tenth transistor TR24 and the eleventh transistor TR25 may be diode-connected transistors. In some embodiments, the diode-connected transistor may operate like a resistor.

That is, the tenth transistor TR24 and the eleventh transistor TR25 may make the voltage drop and thus may clip the voltage level of the second output signal OTA2_OUT, that is, may allow the voltage level of the second output signal OTA2_OUT to be lower than the level of the analog input voltage VDDA. The clipping circuit 330 may perform the clipping operation on the second output signal OTA2_OUT and may adjust the voltage level of the second output signal OTA2_OUT such that the voltage level of the second output signal OTA2_OUT increases only to a level that is equal to or smaller than the level of the digital input voltage VDDD. Afterwards, the second output signal OTA2_OUT may be provided to the counter 152.

An example in which the clipping circuit 330 includes two diode-connected transistors TR24 and TR25 is illustrated in FIG. 6, but the present disclosure is not limited thereto. For example, the clipping circuit 330 may include diode-connected transistors, the number of which is different from that illustrated in FIG. 6. Alternatively or additionally, unlike the example of FIG. 6, the clipping circuit 330 may include PMOS transistors (e.g., as shown in FIG. 9B), may include a resistor (e.g., as shown in FIG. 9G), or may further include a switch connected with a transistor (e.g., as shown in FIGS. 9C to 9F). In some embodiments, the clipping circuit 330 may be connected between the seventh transistor TR21 and the third output node OUT21, not between the seventh transistor TR21 and the power supply voltage VDDA, or may be connected at any other place (e.g., as shown in FIGS. 9H to 9I).

Figure 7:
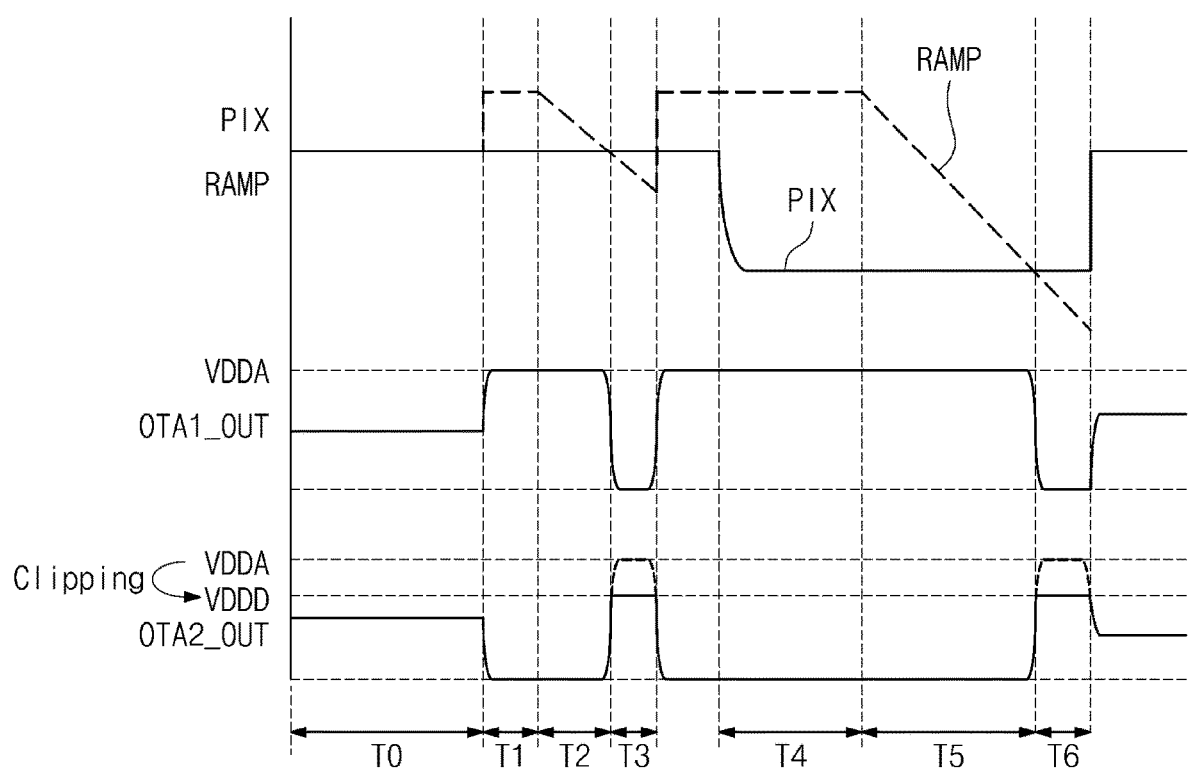
FIG. 7 is a timing diagram illustrating an operation of an analog-to-digital converting circuit of FIG. 4 as an example.

FIG. 7 is a timing diagram illustrating an operation of the analog-to-digital converting (ADC) circuit 150 of FIG. 4 as an example. Below, the description will be given with reference to FIGS. 6 and 7 together. Time period T0 may correspond to an auto-zero period, and time period T1 to time period T3 may correspond to a period in which the comparator 151 compares a reset signal of the pixel signal PIX and the ramp signal RAMP, and time period T4 to time period T6 may correspond to a period in which the comparator 151 compares an image signal of the pixel signal PIX and the ramp signal RAMP.

From time period T3 to time period T6, as the decision of the ADC circuit 150 is made, the voltage level of the first output signal OTA1_OUT may decrease, and the voltage level of the second output signal OTA2_OUT may increase. In this case, through the operation of the clipping circuit 330, the voltage level of the second output signal OTA2_OUT may increase to a level equal to or smaller than the level of the digital input voltage VDDD, not the level of the analog input voltage VDDA. That is, the voltage level of the second output signal OTA2_OUT may be clipped to the level of the digital input voltage VDDD from the level of the analog input voltage VDDA.

Figure 8:
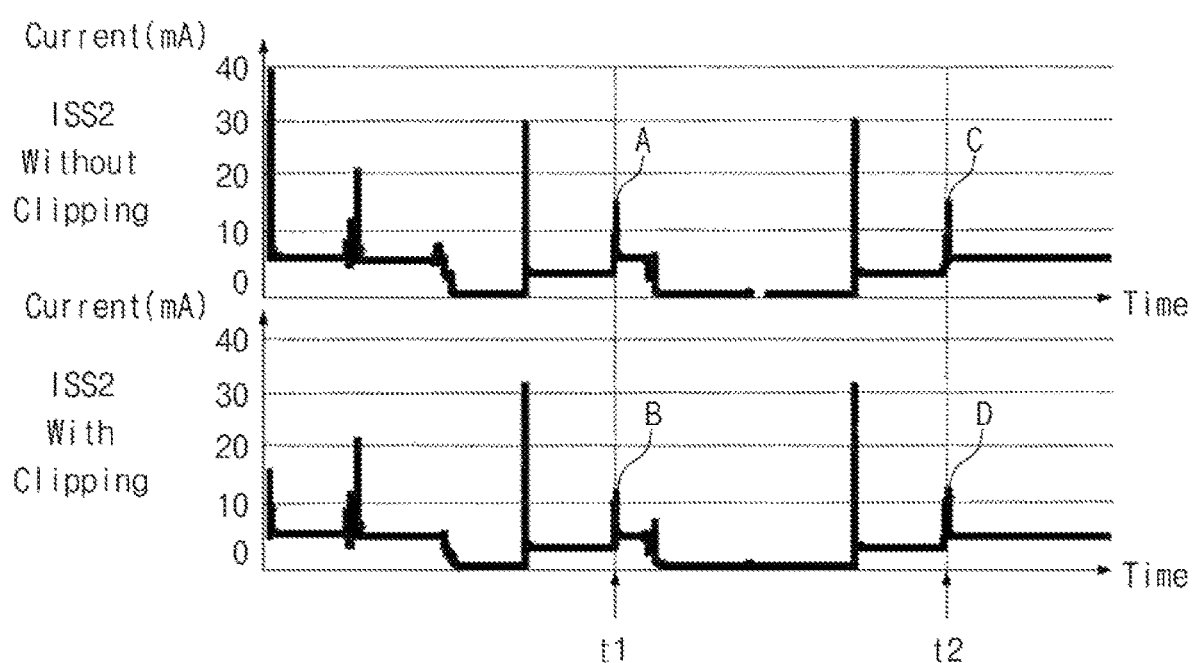
FIG. 8 is a timing diagram illustrating a power current of a second amplifier of FIG. 6 as an example.

FIG. 8 is a timing diagram illustrating the power current ISS2 of the second amplifier 151_2 of FIG. 6 as an example. Time point t1 corresponds to a start time point of time period T3 of FIG. 7, and time point t2 corresponds to a start time point of time period T6 of FIG. 7. Each of time point t1 and time point t2 corresponds to a time at which the voltage level of the first output signal OTA1_OUT starts to decrease and the voltage level of the second output signal OTA2_OUT starts to increase. Peak currents "B" and "D" (e.g., about 11 mA) when the output voltage clipping operation is performed may be decreased compared to peak currents "A" and "C" (e.g., about 15 mA) when the output voltage clipping operation is not performed. That is, power consumption of the ADC circuit 150 may decrease through the output voltage clipping.

Figure 9A:
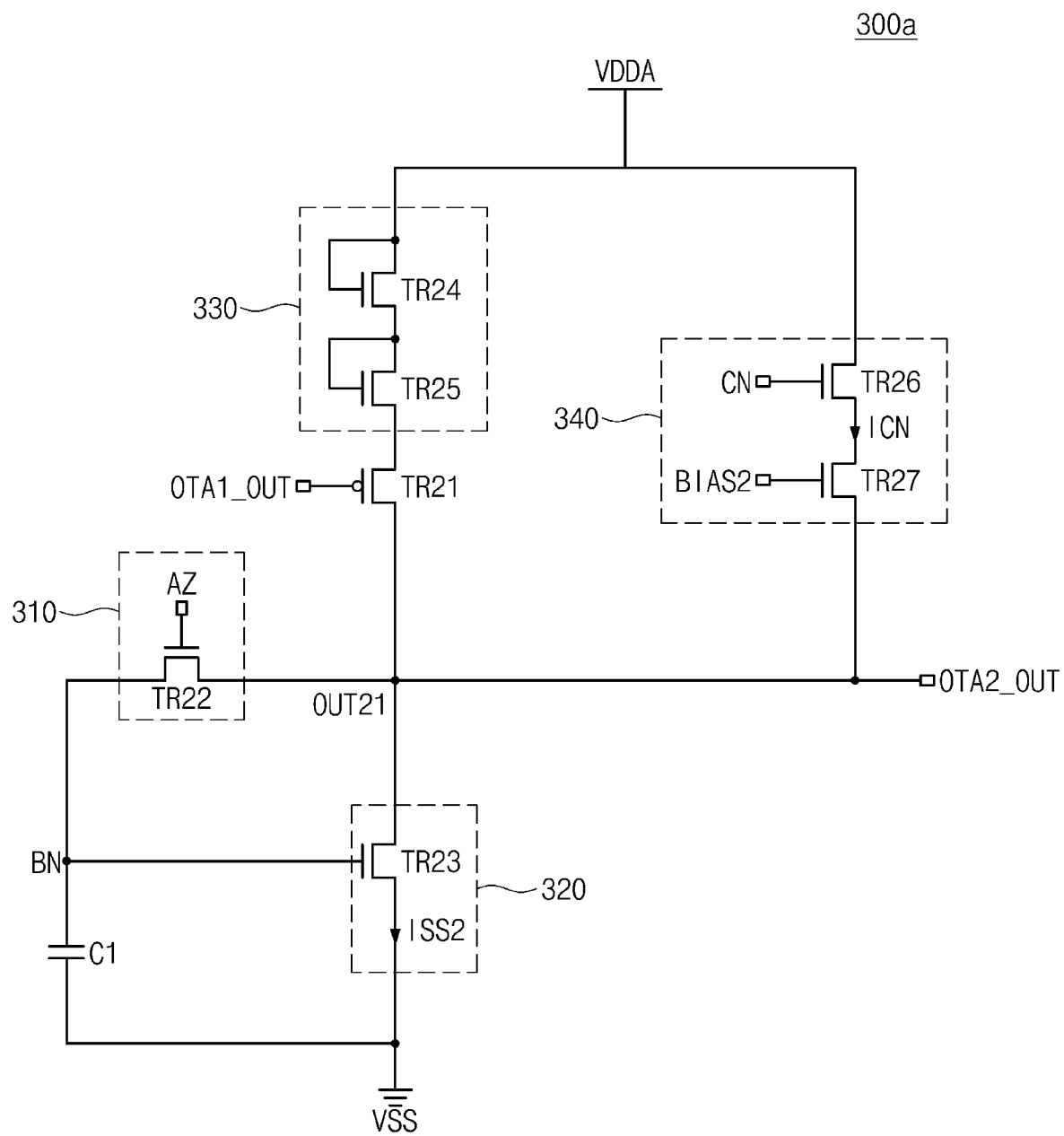
FIGS. 9A to FIG. 9I are circuit diagrams illustrating other examples of a second amplifier of FIG. 4.
Figure 9B:
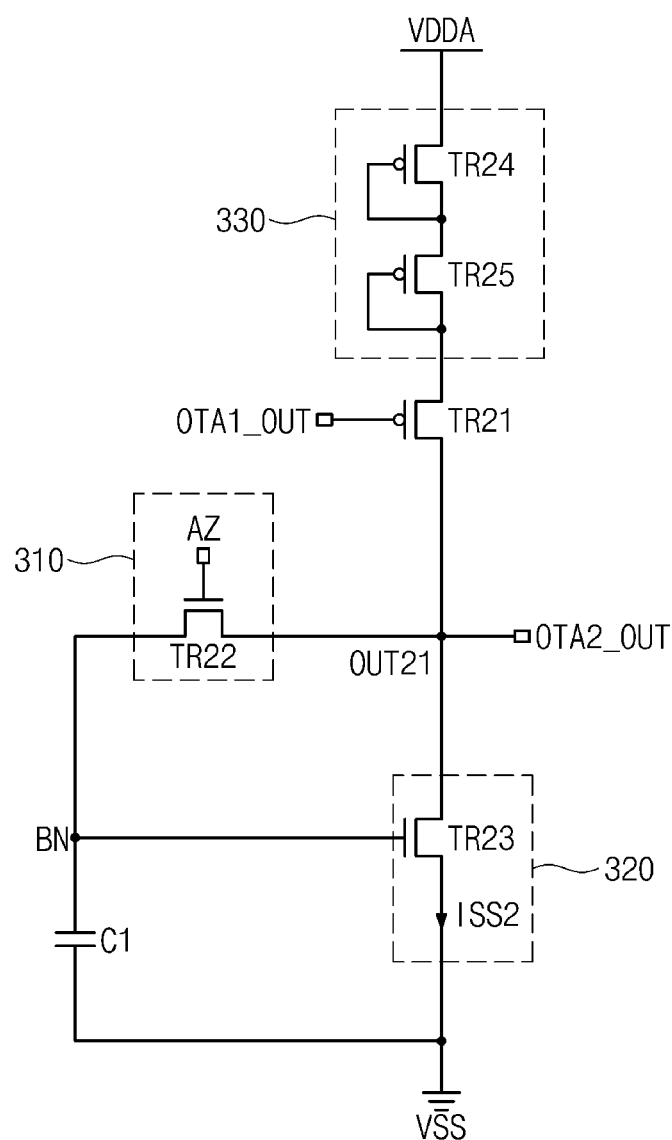

FIG. 9A is a circuit diagram illustrating another example of the second amplifier 151_2 of FIG. 4. A second amplifier 300a may include or may be similar in many respects to at least one of the second amplifier 151_2 described above with reference to FIG. 4 and the second amplifier 300 described above with reference to FIG. 6, and may include additional features not mentioned above. The second amplifier 300a may further include a control circuit 340. The control circuit 340 may adjust an output of a control current ICN to alleviate a power consumption difference of the second amplifier 300a before and after the comparison operation is performed. The control circuit 340 may include twelfth and thirteenth transistors TR26 and TR27 that are connected between the power supply voltage VDDA and the third output node OUT21 and is connected in parallel with the seventh transistor TR21.

The twelfth transistor TR26 may operate in response to a control signal CN, and the thirteenth transistor TR27 may operate in response to a second bias signal BIAS2. For example, the twelfth and thirteenth transistors TR26 and TR27 may be NMOS transistors. However, the present disclosure is not limited thereto. The twelfth and thirteenth transistors TR26 and TR27 may be implemented with transistors whose types are different from those illustrated in FIG. 12.

When the control signal CN is deactivated, the twelfth transistor TR26 may be turned off, and the control current ICN may not flow through the thirteenth transistor TR27. Alternatively or additionally, when the twelfth transistor TR26 is turned on by the activated control signal CN and the thirteenth transistor TR27 is turned on by the second bias signal BIAS2, the control current ICN may flow to the third output node OUT21 through the twelfth transistor TR26 and the thirteenth transistor TR27.

After the decision about a large-small relationship between the level of the ramp signal RAMP and the level of the pixel signal PIX is completed, the level of the power current ISS2 may increase, and a power may be continuously consumed even after the comparison operation is performed. As such, as a power consumption difference before and after the comparison operation is performed is continuously maintained, the performance of an image sensor may be reduced.

The control circuit 340 may operate to prevent the reduction of performance of the image sensor. After the ramp signal RAMP starts to ramp down, as the control signal CN and the second bias signal BIAS2 are activated, as described above, the control current ICN may flow to the third output node OUT21 through the twelfth and thirteenth transistors TR26 and TR27, and the level of the power current ISS2 may be increased as much as the level of the control current ICN.

For example, the level (hereinafter referred to as a "second level") of the power current ISS2 increased as much as the level of the control current ICN after the ramp signal RAMP starts to ramp down may be higher than the level (hereinafter referred to as a "first level") of the power current ISS2 before the comparison operation is performed, and may be lower than the level (hereinafter referred to as a "third level") of the power current ISS2 after the comparison operation is performed (e.g., after the decision about the large-small relationship between the voltage level of the ramp signal RAMP and the voltage level of the pixel signal PIX is completed).

According the above operation of the control circuit 340, both a difference between the first level and the second level and a difference between the second level and the third level may be smaller than a difference between the first level and the third level. As such, a power consumption difference before and after the comparison operation of the second amplifier 300a may be alleviated, and the reduction of performance of the image sensor may be improved. The control circuit 340 illustrated in FIG. 9A may be implemented in circuits of FIGS. 9B to 9I and 11 to be described below.

FIGS. 9B to 9I are circuit diagrams illustrating other examples of the second amplifier 151_2 of FIG. 4. Configurations and operations of second amplifiers illustrated in FIGS. 9B to 9I are the same as the configuration and the operation of the second amplifier 300 described with reference to FIG. 6 except for the configuration of the clipping circuit 330, and thus, additional description will be omitted to avoid redundancy.

Referring to FIG. 9B, the clipping circuit 330 of a second amplifier 300b may include the tenth transistor TR24 and the eleventh transistor TR25 that are connected between the power supply voltage VDDA and the seventh transistor TR21 and are respectively diode-connected. The tenth transistor TR24 and the eleventh transistor TR25 of FIG. 9B may be PMOS transistors.

Figure 9C:
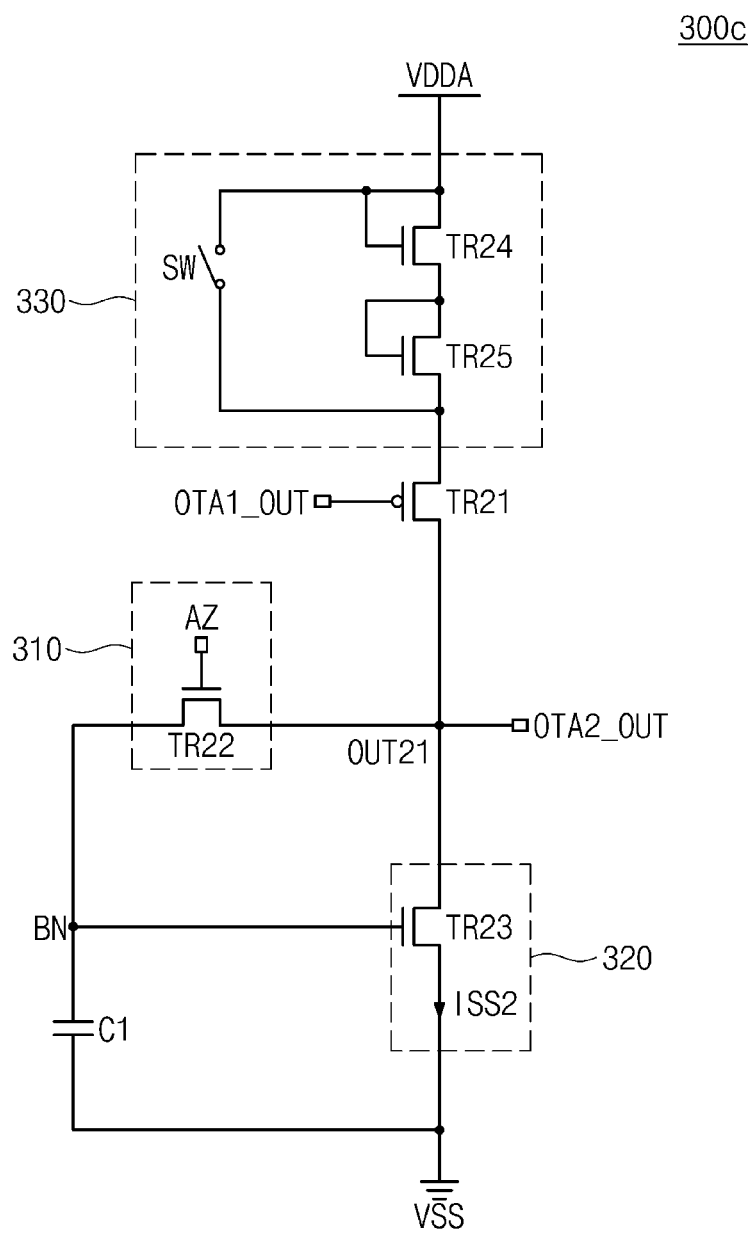

Referring to FIG. 9C, the clipping circuit 330 of a second amplifier 300c may include the tenth transistor TR24 and the eleventh transistor TR25 that are connected between the power supply voltage VDDA and the seventh transistor TR21 and are respectively diode-connected, and a switch SW that is connected between the drain terminal of the tenth transistor TR24 and the source terminal of the eleventh transistor TR25. The tenth transistor TR24 and the eleventh transistor TR25 of FIG. 9C may be NMOS transistors.

The switch SW of the second amplifier 300c may enable and/or disable the operation of the clipping circuit 330. When the switch SW is turned on, the clipping circuit 330 may perform the output voltage clipping operation and may adjust the voltage level of the second output signal OTA2_OUT to a level being equal to or smaller than the level of the digital input voltage VDDD. In contrast, when the switch SW is turned off, the clipping circuit 330 may not perform the output voltage clipping operation, and the voltage level of the second output signal OTA2_OUT may reach the level of the analog input voltage VDDA.

Figure 9D:
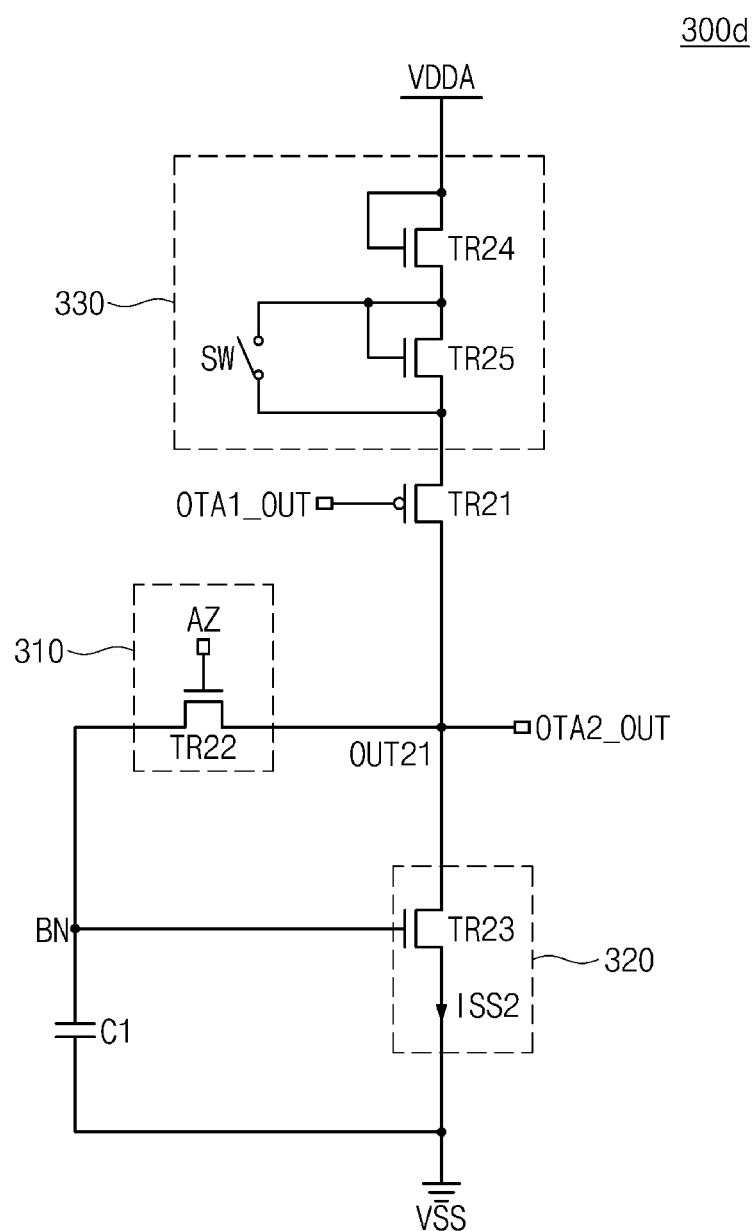

Referring to FIG. 9D, the clipping circuit 330 of a second amplifier 300d may include the tenth transistor TR24 and the eleventh transistor TR25 that are connected between the power supply voltage VDDA and the seventh transistor TR21 and are respectively diode-connected, and the switch SW that is connected between the drain terminal and the source terminal of the eleventh transistor TR25. The tenth transistor TR24 and the eleventh transistor TR25 of FIG. 9D may be NMOS transistors.

The switch SW of FIG. 9D may adjust a magnitude of a voltage level to be clipped, by enabling or disabling only the operation of the eleventh transistor TR25. When the switch SW is turned on, both the tenth transistor TR24 and the eleventh transistor TR25 may operate. In this case, the clipping circuit 330 may make the greater voltage drop than in the case where only the tenth transistor TR24 operates (e.g., the switch SW is turned off). This may indicate that the voltage level of the second output signal OTA2_OUT is clipped more greatly.

Figure 9E:
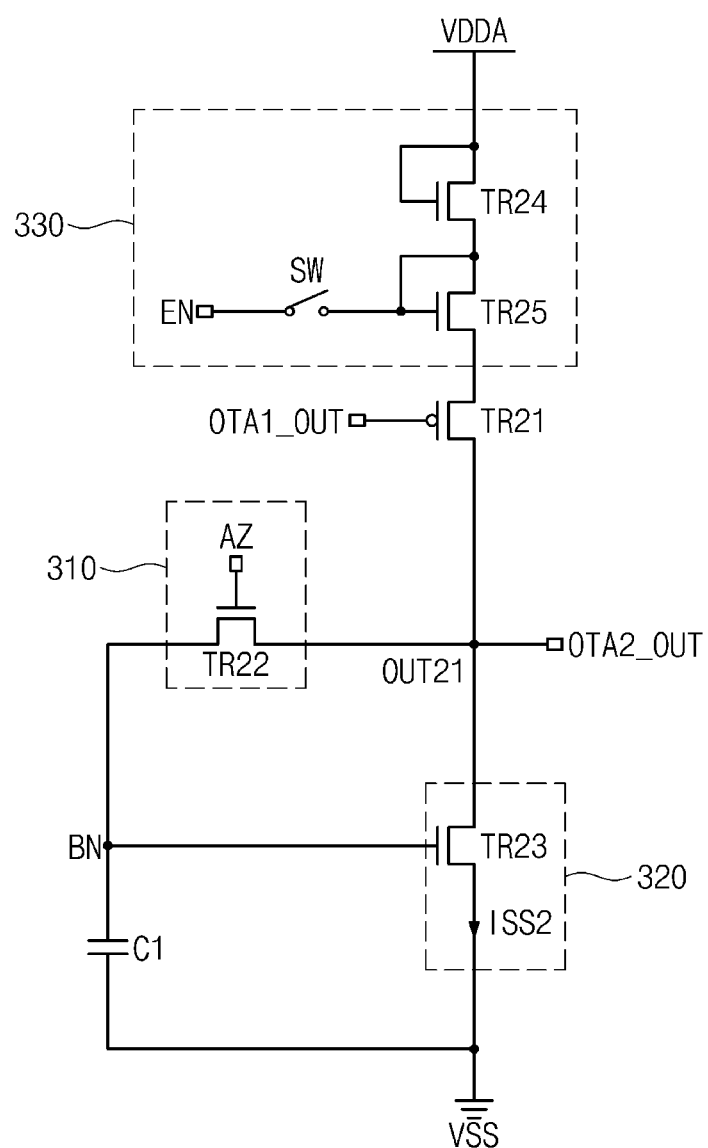

Referring to FIG. 9E, the clipping circuit 330 of a second amplifier 300e may include the tenth transistor TR24 and the eleventh transistor TR25 that are connected between the power supply voltage VDDA and the seventh transistor TR21 and are respectively diode-connected, and the switch SW that is connected with the gate terminal of the eleventh transistor TR25. The tenth transistor TR24 and the eleventh transistor TR25 of FIG. 9E may be NMOS transistors.

Like FIG. 9D, the switch SW of FIG. 9E may enable and/or disable only the operation of the eleventh transistor TR25. However, unlike FIG. 9D, the operation of the eleventh transistor TR25 of FIG. 9E may be enabled only when the switch SW is turned on and the enable signal is activated. When the switch SW is turned off or when the enable signal EN is deactivated even though the switch SW is turned on, the operation of the eleventh transistor TR25 may be disabled, and only the tenth transistor TR24 may operate.

Figure 9F:
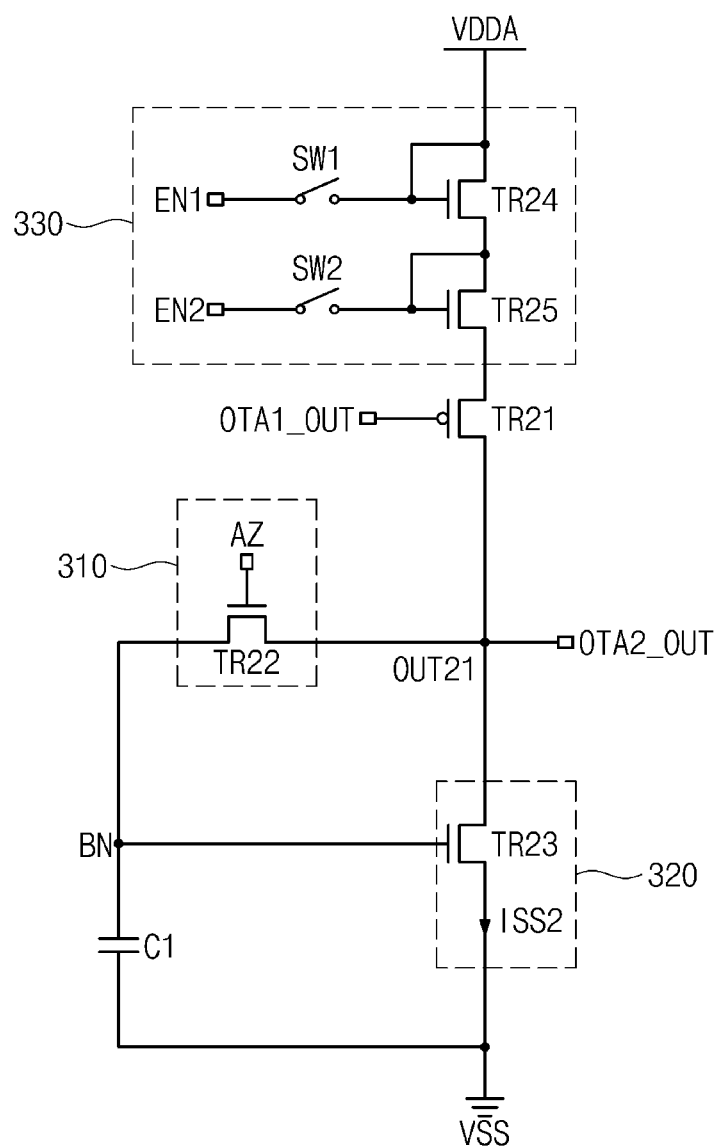
Figure 9G:
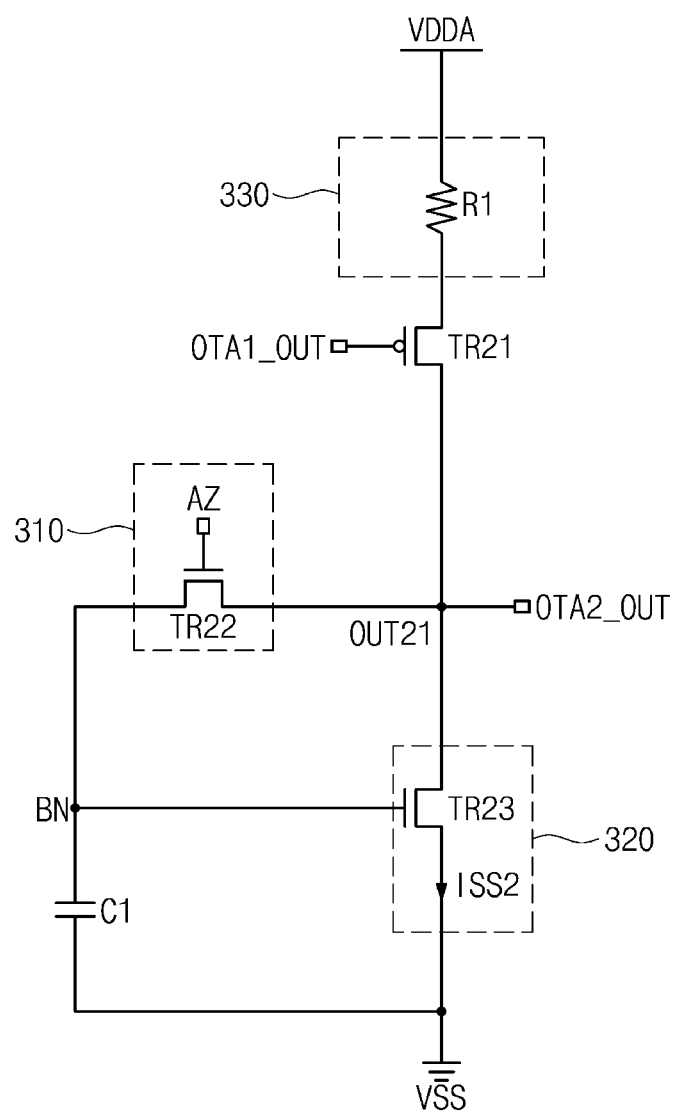
Figure 9H:
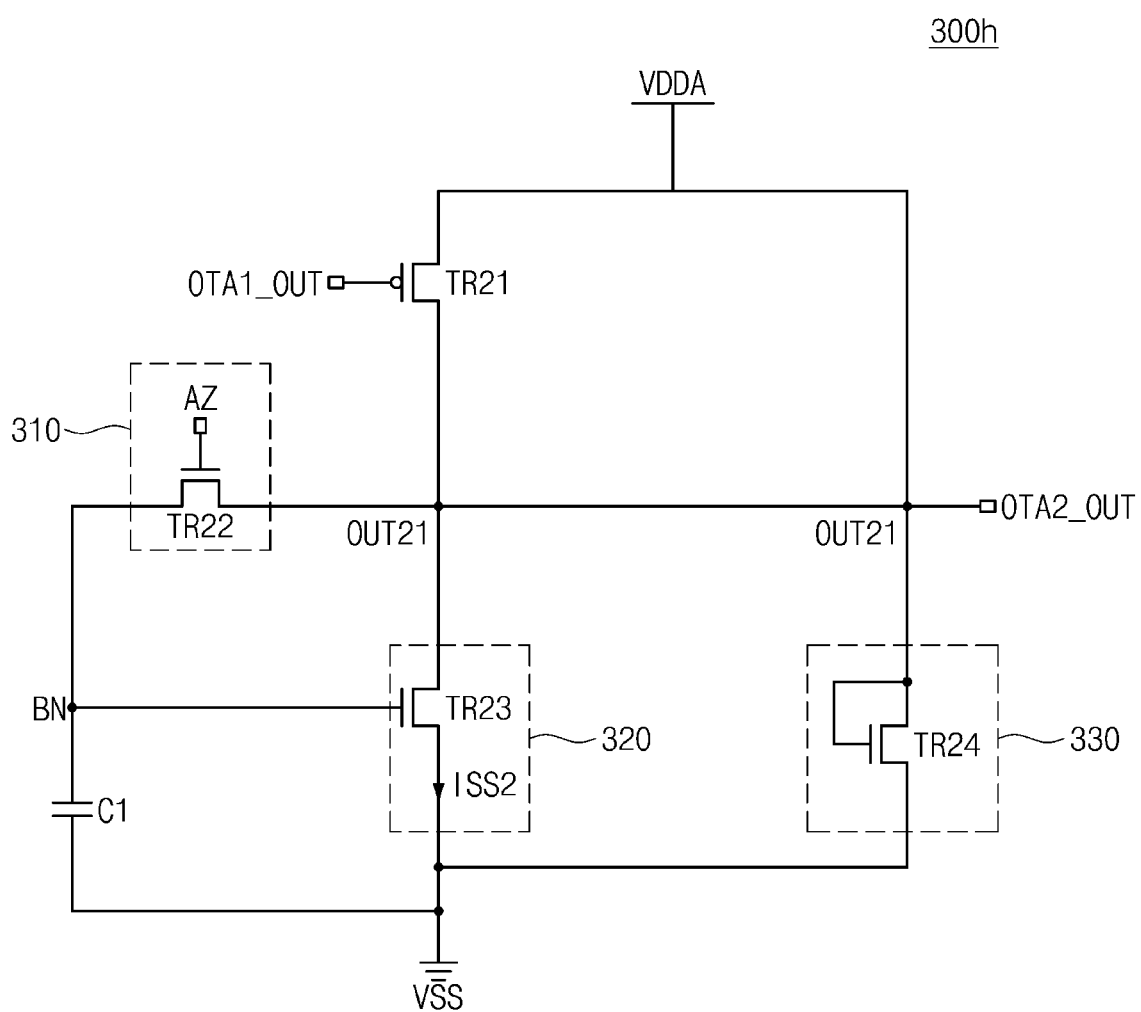
Figure 9I:
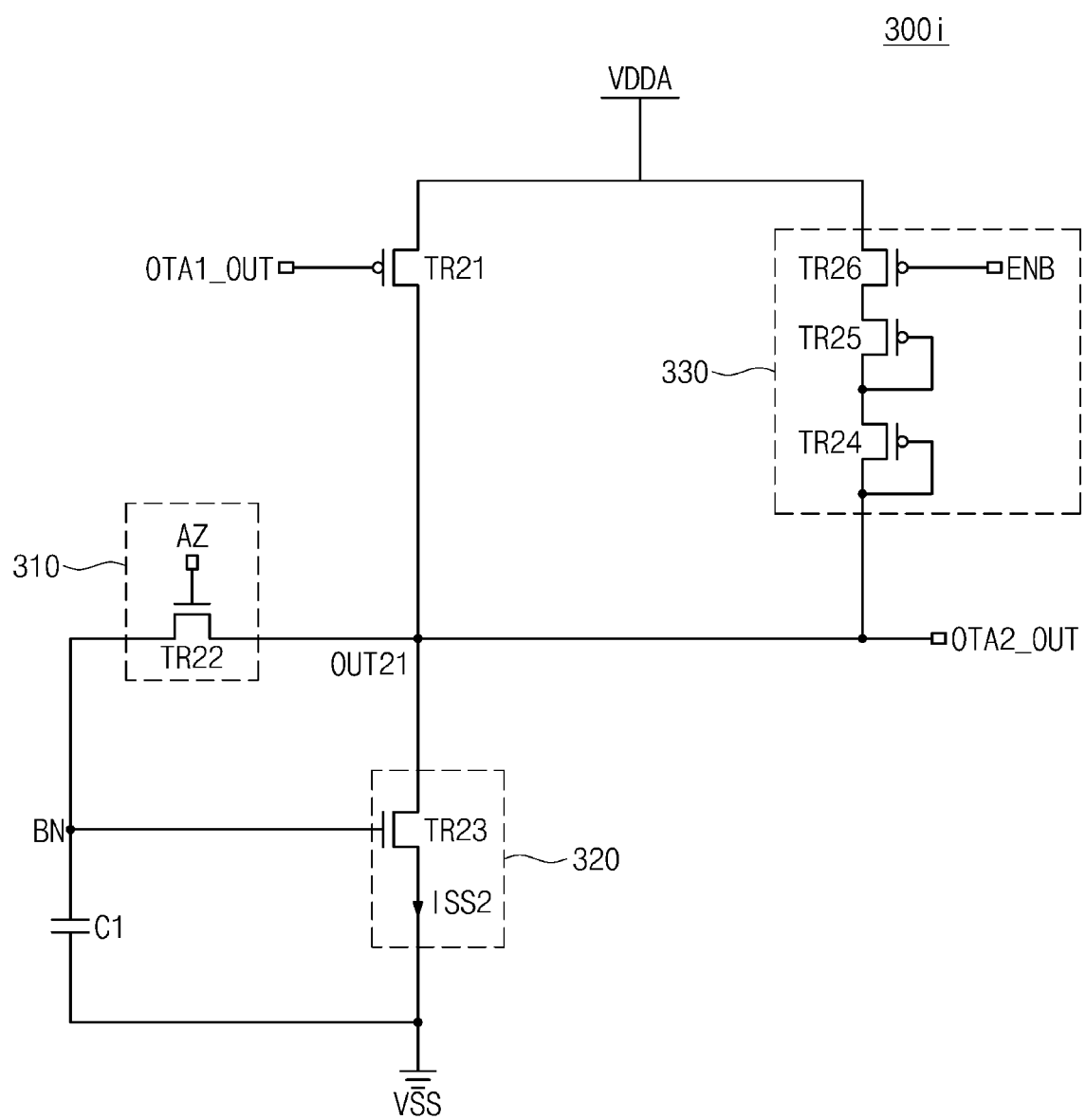

Referring to FIG. 9F, the clipping circuit 330 of a second amplifier 300f may include the tenth transistor TR24 and the eleventh transistor TR25 that are connected between the power supply voltage VDDA and the seventh transistor TR21 and are respectively diode-connected, a first switch SW1 connected with the gate terminal of the tenth transistor TR24, and a second switch SW2 connected with the gate terminal of the eleventh transistor TR25. The tenth transistor TR24 and the eleventh transistor TR25 of FIG. 9F may be NMOS transistors.

The first switch SW1 of FIG. 9F may enable and/or disable the operation of the tenth transistor TR24, and the second switch SW2 may enable and/or disable the operation of the eleventh transistor TR25. The operation of the tenth transistor TR24 may be enabled only when the first switch SW1 is turned on and a first enable signal EN1 is activated, and the operation of the eleventh transistor TR25 may be enabled only when the second switch SW2 is turned on and a second enable signal EN2 is activated.

Accordingly, depending on whether the first switch SW1 and the second switch SW2 are turned on or turned off and whether the first enable signal EN1 and the second enable signal EN2 are activated or deactivated, the operations of the tenth transistor TR24 and the eleventh transistor TR25 may be selectively activated or deactivated, and thus, a magnitude of a voltage level to be clipped may be determined.

Referring to FIG. 9G, the clipping circuit 330 of a second amplifier 300g may include a resistor R1 connected between the power supply voltage VDDA and the seventh transistor TR21. As described with reference to FIG. 6, because a resistor and a diode-connected transistor perform the same operation, the voltage level of the second output signal OTA2_OUT may be clipped depending on a magnitude of a voltage drop that is determined depending on a resistance value of the resistor.

Referring to FIG. 9H, the clipping circuit 330 of a second amplifier 300h may include the tenth transistor TR24 that is connected between the third output node OUT21 and a source terminal of the ninth transistor TR23 and is diode-connected. The tenth transistor TR24 of FIG. 9H may be an NMOS transistor. A configuration and an operation of the second amplifier 300h are the same as the configuration and the operation of the second amplifier 300 described with reference to FIG. 6 except for the connection relationship of the clipping circuit 330.

Referring to FIG. 9I, the clipping circuit 330 of a second amplifier 300i may include the tenth transistor TR24 and the eleventh transistor TR25 that are connected between the third output node OUT21 and the source terminal of the seventh transistor TR21 are respectively diode-connected, and the twelfth transistor TR26 that is turned on or turned off in response to an inverted enable signal ENB. The tenth to twelfth transistors TR24 to TR26 of FIG. 9I may be PMOS transistors. Alternatively or additionally, the inverted enable signal ENB may be a signal whose phase is opposite to the phase of the enable signals EN, EN1, and EN2 described with reference to FIGS. 9E to 9F.

Operations of the tenth transistor TR24 and the eleventh transistor TR25 that are respectively diode-connected may be the same as the operations of the tenth transistor TR24 and the eleventh transistor TR25 of FIG. 9B, and the twelfth transistor TR26 may function as a switch that enables or disables the operations of the tenth transistor TR24 and the eleventh transistor TR25. When the inverted enable signal ENB is activated, the twelfth transistor TR26 may be turned on. In this case, the operations of the tenth transistor TR24 and the eleventh transistor TR25 may be enabled, and the second output signal OTA2_OUT may be clipped. However, when the twelfth transistor TR26 is turned off, the operations of the tenth transistor TR24 and the eleventh transistor TR25 may be disabled, and the second output signal OTA2_OUT may not be clipped.

Various embodiments of the second amplifier 151_2 of FIG. 4 including the clipping circuit are described with reference to FIGS. 6 and 9A to 9I. However, the present disclosure is not limited thereto. For example, the clipping circuit may be implemented to be different from those illustrated in FIGS. 6 and 9A to 9I.

Figure 10:
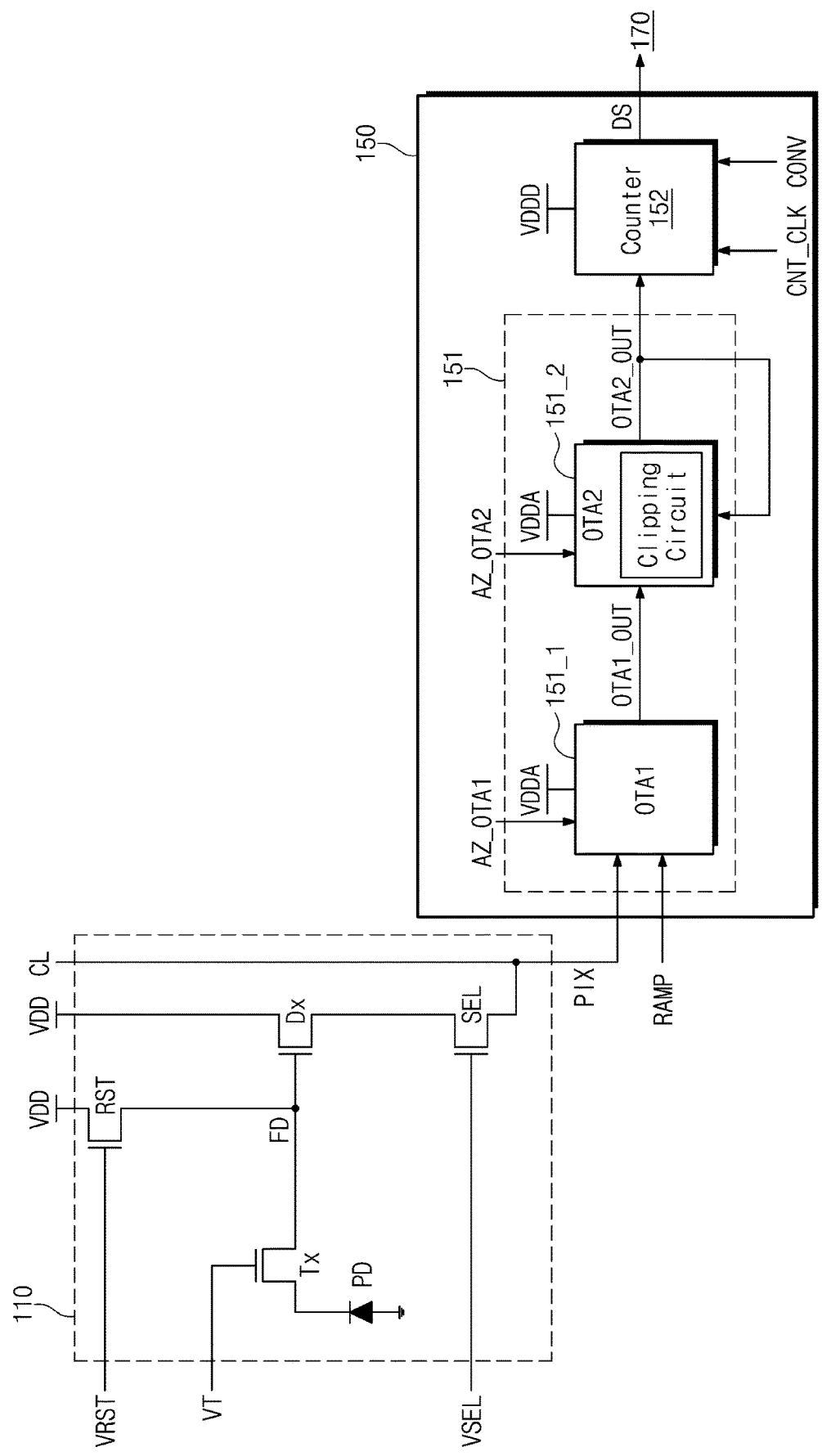
FIG. 10 illustrates another example of a configuration of an analog-to-digital converting circuit of FIG. 2.

FIG. 10 illustrates another example of a configuration of the analog-to-digital converting (ADC) circuit 150 of FIG. 2. Referring to FIG. 10, the first amplifier 151_1 may be initialized in response to a first auto-zero signal AZ_OTA1, and the second amplifier 151_2 may be initialized in response to a second auto-zero signal AZ_OTA2. An auto-zero period of the first amplifier 151_1 is referred to as a "first auto-zero period", and an auto-zero period of the second amplifier 151_2 is referred to as a "second auto-zero period".

When the initialization of the second amplifier 151_2 is completed before the initialization of the first amplifier 151_1, the second auto-zero period may be adjusted to be terminated, regardless of the remaining length of the first auto-zero period. That is, the second auto-zero period of the present disclosure may be optimized to be terminated at a time when the initialization of the second amplifier 151_2 is completed. For example, the second amplifier 151_2 may be implemented such that, when the second auto-zero period ends, a power is not consumed until the comparison operation of the first amplifier 151_1 is performed. To this end, the second amplifier 151_2 may include a switch for temporarily stopping power consumption in response to that the second auto-zero period ends.

Alternatively or additionally, referring to FIG. 10, the second output signal OTA2_OUT may be fed back to the second amplifier 151_2. The second output signal OTA2_OUT fed back to the second amplifier 151_2 may control a power source (e.g., a current source) of the second amplifier 151_2 and may reduce power consumption of the ADC circuit 150. The output feedback operation of the second amplifier 151_2 described above may be performed both when the reset signal of the pixel signal PIX and the ramp signal RAMP are compared and when the image signal of the pixel signal PIX and the ramp signal RAMP are compared.

That is, as the ADC circuit 150 of FIG. 10 further performs the auto-zero period optimization operation and/or the output feedback operation, in addition to the output voltage clipping operation, the power consumption of the ADC circuit 150 of FIG. 4 may further decrease. The function of the ADC circuit 150 of FIG. 10 is the same as that described with reference to FIG. 4 except for the auto-zero period optimization operation and the output feedback operation, and thus, additional description will be omitted to avoid redundancy.

Figure 11:
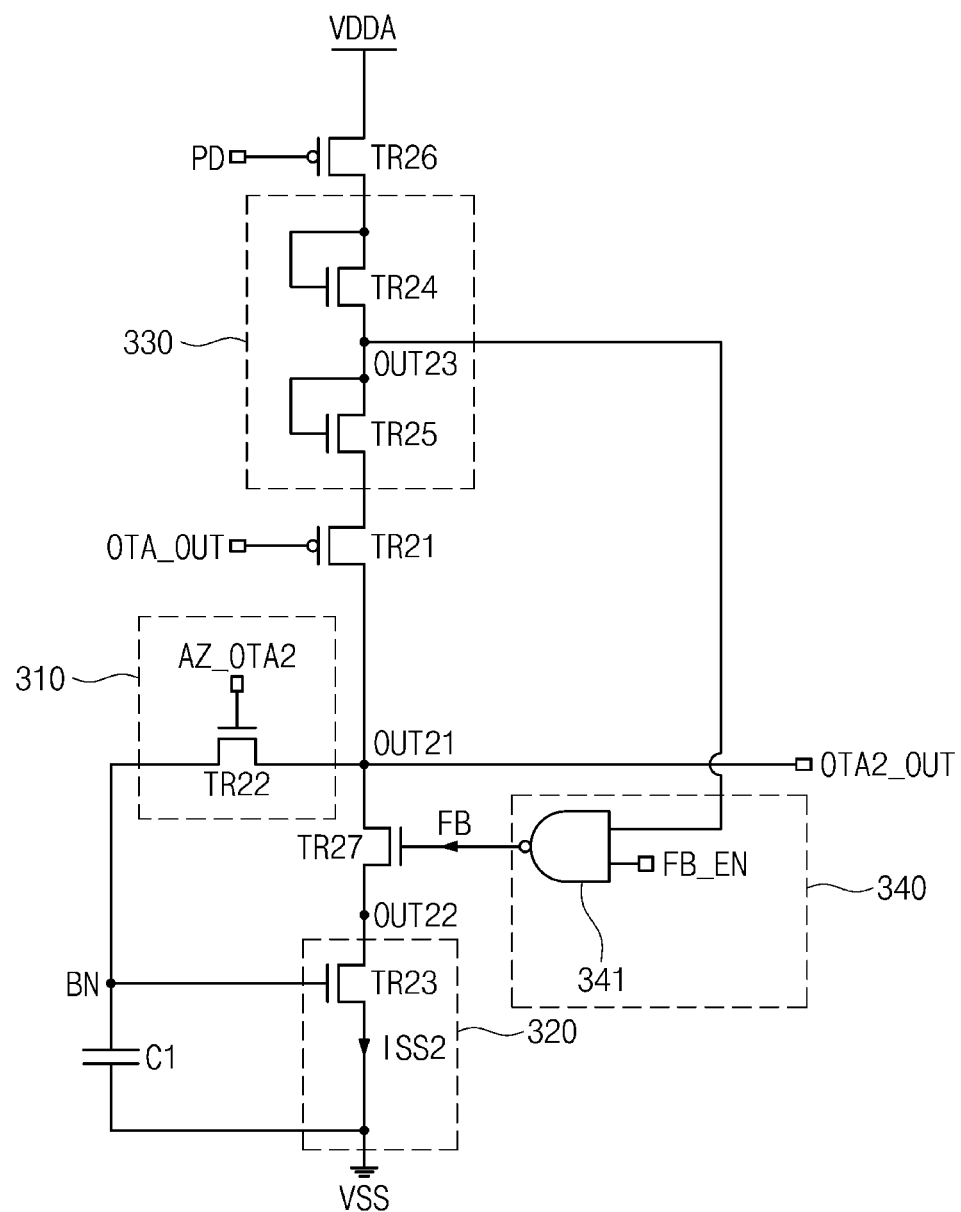
FIG. 11 is a circuit diagram illustrating an example of a second amplifier of FIG. 10.

FIG. 11 is a circuit diagram illustrating an example of the second amplifier 151_2 of FIG. 10. A second amplifier 300j may include a plurality of transistors TR21 to TR27, the capacitor C1, the switching circuit 310, the current source 320, the clipping circuit 330, and a feedback circuit 340. For example, the seventh and twelfth transistors TR21 and TR26 may be PMOS transistors, and the eighth to eleventh transistors TR22 to TR25 and the thirteenth transistor TR27 may be NMOS transistors. However, the present disclosure is not limited thereto. The seventh to thirteenth transistors TR21 to TR27 may be implemented with transistors whose types are different from those illustrated in FIG. 11. A configuration and an operation of the second amplifier 300j of FIG. 11 are the same as the configuration and the operation of the second amplifier 300 of FIG. 6 except that operations of the twelfth transistor TR26 and the feedback circuit 340, and thus, additional description will be omitted to avoid redundancy.

When charges are fully charged in the capacitor C1 connected with the bias node BN, the second auto-zero signal AZ_OTA2 may be deactivated, and the second auto-zero period may end. In this case, the twelfth transistor TR26 may be turned off in response to a power down signal PD activated, and thus, the operation of the second amplifier 300j may be temporarily stopped (e.g., may be temporarily powered down). That is, the twelfth transistor TR26 may operate as a power down switch of the second amplifier 300j.

The operation of the second amplifier 300j may be stopped until the first amplifier 151_1 of FIG. 10 performs the comparison operation. That is, when the first auto-zero period of the first amplifier 151_1 of FIG. 10 ends (e.g., when the first auto-zero signal AZ_OTA1 is deactivated), the power down signal PD may be deactivated, and the twelfth transistor TR26 may be turned on. As such, the second amplifier 300j may again start to operate.

That is, the twelfth transistor TR26 may be turned on in response to the power down signal PD of the low level during the second auto-zero period and during the comparison operation period and may be turned off in response to the power down signal PD of the high level between the second auto-zero period and the comparison operation period. Through the above operation of the twelfth transistor TR26, the power consumption of the second amplifier 300j may be decreased between the second auto-zero period and the comparison operation period.

The thirteenth transistor TR27 may be connected between the third output node OUT21 and a fourth output node OUT22. The thirteenth transistor TR27 may operate in response to an output of the feedback circuit 340 that controls the output feedback operation. For example, when the thirteenth transistor TR27 is turned off, the power current ISS2 may not flow through the thirteenth transistor TR27, and the power consumption of the second amplifier 300j may decrease.

However, the present disclosure is not limited thereto. For example, the thirteenth transistor TR27 may be implemented to be different from the connection illustrated in FIG. 11. In addition, the thirteenth transistor TR27 is illustrated as being an NMOS transistor, but may be implemented with a combination of a PMOS transistor and a logic gate (e.g., an AND gate).

The feedback circuit 340 may control the current source 320 based on the second output signal OTA2_OUT and a feedback enable signal FB_EN. To perform the output feedback operation, the feedback circuit 340 may include a logic gate 341. For example, the logic gate 341 may be a NAND gate.

The logic gate 341 may output a feedback signal FB in response to a signal associated with the second output signal OTA2_OUT and the feedback enable signal FB_EN. For example, the logic gate 341 may be implemented such that the voltage level of the feedback signal FB is set to the low level when both the voltage level of the feedback signal FB and the voltage level of a fifth output node OUT23 are at the high level.

In detail, after the comparison operation of the ramp signal RAMP and the pixel signal PIX is terminated, the voltage level of the first output signal OTA1_OUT may be set to the low level, and the voltage level of the second output signal OTA2_OUT may increase. Accordingly, the voltage level of the fifth output node OUT23 may be set to the high level. In this case, before the feedback enable signal FB_EN is activated, the feedback signal FB may be at the high level, the thirteenth transistor TR27 may be in a turn-on state, and the power current ISS2 may flow through the seventh transistor TR27.

In contrast, when the feedback enable signal FB_EN is activated (e.g., when the voltage level of the feedback enable signal FB_EN is the high level), the voltage level of the feedback signal FB may transition to the low level. In this case, because the thirteenth transistor TR27 is turned off, the power current ISS2 may not flow through the thirteenth transistor TR27. As such, by utilizing the output feedback after the comparison operation is terminated, the power consumption of the second amplifier 300*j* may decrease. This may mean that power consumption of the ADC circuit 150 also decreases.

As a power consumption difference before and after the comparison operation is performed is continuously maintained, the performance of an image sensor (e.g., the performance of an ADC circuit converting a pixel signal into a digital signal) may be reduced. According to the above operation of the feedback circuit 340, the power current ISS2 may not flow through the output nodes OUT21 and OUT23 after the comparison operation is performed, and thus, a power consumption difference before and after the comparison operation is performed may decrease. Accordingly, the reduction of performance of the image sensor may be improved by the operation of the feedback circuit 340.

While the logic gate 341 of FIG. 11 is illustrated as being a NAND gate, the present disclosure is not limited thereto. For example, the feedback circuit 340 may be implemented as any other component(s) (e.g., a NOR gate and an inversion amplifier) such that the feedback signal FB is set to the low level when the voltage level of the signal associated with the second output signal OTA2_OUT (e.g., the voltage level of the fifth output node OUT23) is the high level. Alternatively or additionally, the logic gate 341 of FIG. 11 is illustrated as receiving, as an input, the signal associated with the second output signal OTA2_OUT, that is, the voltage level of the fifth output node OUT23, but the present disclosure is not limited thereto. The logic gate 341 may receive, as an input, the second output signal OTA2_OUT and any other signals based on the second output signal OTA2_OUT.

As a result, compared to the second amplifier 300 of FIG. 6, the second amplifier 300*j* of FIG. 11 may further reduce the power consumption by using the operation of the twelfth transistor TR26 according to the optimization of the second auto-zero period and the operation of the feedback circuit 340, as well as the operation of the clipping circuit 330.

Figure 12:
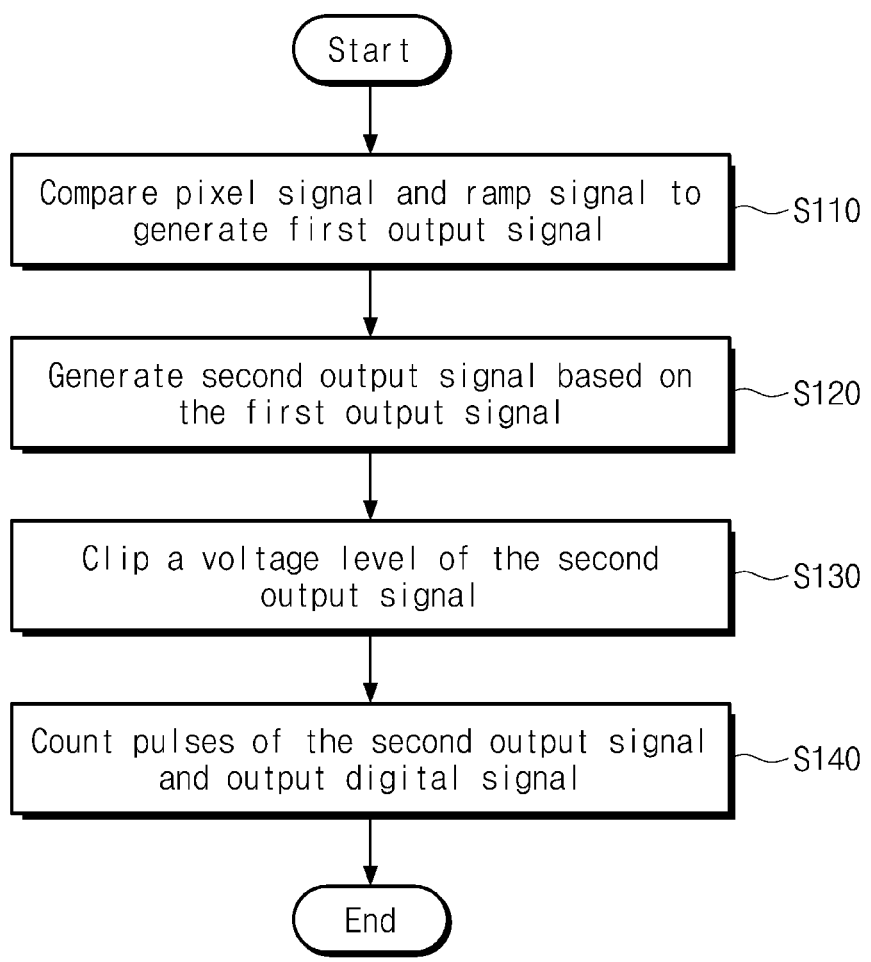
FIG. 12 is a flowchart illustrating an operation method of an analog-to-digital converting circuit using an output voltage clipping operation according to an embodiment of the present disclosure.

FIG. 12 is a flowchart illustrating an operation method of an analog-to-digital converting (ADC) circuit using an output voltage clipping operation according to an embodiment of the present disclosure. Operation S110 and operation S120 may be performed based on the analog power supply voltage (or analog input voltage) VDDA, and operation S140 may be based on the digital power supply voltage (or digital input voltage) VDDD. FIG. 12 is described with reference to FIGS. 2, 4, and 6 together.

In operation S110, the first amplifier 151_1 may compare the pixel signal PIX from the pixel array 110 and the ramp signal RAMP to generate the first output signal OTA1_OUT. For example, in operation S110, the first amplifier 151_1 may compare the reset signal of the pixel signal PIX and the ramp signal RAMP, may compare the image signal of the pixel signal PIX and the ramp signal RAMP, and may perform correlated double sampling (CDS) on comparison results. In operation S120, the second amplifier 151_2 may generate the second output signal OTA2_OUT based on the first output signal OTA1_OUT. For example, the second output signal OTA2_OUT may be an inverted version of the first output signal OTA1_OUT.

In operation S130, the second amplifier 151_2 may clip the voltage level of the second output signal OTA2_OUT. For example, the second amplifier 151_2 may include a clipping circuit (e.g., clipping circuit 330 of FIG. 6), and the clipping circuit 330 may perform the clipping operation on the second output signal OTA2_OUT and may adjust the voltage level of the second output signal OTA2_OUT such that the voltage level of the second output signal OTA2_OUT increases only to a level that is equal to or smaller than the level of the digital input voltage VDDD. In operation S140, the counter 152 may count pulses of the second output signal OTA2_OUT and may output a counting result as a digital signal.

According to an embodiment of the present disclosure, power consumption of an analog-to-digital converting circuit may decrease by using output voltage clipping. Alternatively or additionally, according to an embodiment of the present disclosure, the area (or size) of a count in the analog-to-digital converting circuit may decrease, and a value of a peak current may decrease when a comparison operation is performed.

While the present disclosure has been described with reference to embodiments thereof, it will be apparent to those of ordinary skill in the art that various changes and modifications may be made thereto without departing from the spirit and scope of the present disclosure as set forth in the following claims.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

What is claimed is:

1. A circuit, comprising:
    a first amplifier configured to operate based on a first power supply voltage and to generate a first output signal by comparing a ramp signal and a reset signal of a pixel signal output from a pixel array during a first operation period and comparing the ramp signal and an image signal of the pixel signal output from the pixel array during a second operation period;

a second amplifier configured to operate based on the first power supply voltage and to generate a second output signal based on the first output signal; and a counter configured to operate based on a second power supply voltage, to count pulses of the second output signal, and to output a counting result as a digital signal, wherein a first level of the first power supply voltage is greater than a second level of the second power supply voltage, and wherein the second amplifier is further configured to adjust a voltage level of the second output signal from a low level to a third level, wherein the third level is less than or equal to the second level of the second power supply voltage.

2. The circuit of claim 1, wherein the second amplifier includes:

a first transistor configured to provide the first power supply voltage to a first output node, from which the second output signal is output, in response to the first output signal;

a clipping circuit coupled between a power supply voltage terminal and the first transistor, and configured to adjust the voltage level of the second output signal by causing a voltage drop between the power supply voltage terminal and the first transistor; and a current source coupled with the first transistor through the first output node, and configured to generate a power current.

3. The circuit of claim 2, wherein the clipping circuit includes a second transistor and a third transistor, wherein a drain terminal of the second transistor is coupled to a gate terminal of the second transistor, and wherein a drain terminal of the third transistor is coupled to a gate terminal of the third transistor.

4. The circuit of claim 3, wherein the clipping circuit further includes:

a switch coupled between the drain terminal of the second transistor and a source terminal of the third transistor.

5. The circuit of claim 3, wherein the clipping circuit further includes:

a switch coupled between the drain terminal and a source terminal of the third transistor.

6. The circuit of claim 3, wherein the clipping circuit further includes:

a switch coupled with the gate terminal of the third transistor, wherein the third transistor operates in response to an enable signal applied to the gate terminal of the third transistor.

7. The circuit of claim 3, wherein the clipping circuit further includes:

a first switch coupled with the gate terminal of the second transistor; and a second switch coupled with the gate terminal of the third transistor, wherein the second transistor operates in response to a first enable signal applied to the gate terminal of the second transistor, and wherein the third transistor operates in response to a second enable signal applied to the gate terminal of the third transistor.

8. The circuit of claim 2, wherein the clipping circuit includes a resistor coupled between the power supply voltage terminal and the first transistor.

9. The circuit of claim 2, wherein the second amplifier further includes:

a control circuit configured to output a control current in response to a control signal, wherein the control circuit includes:

a second transistor configured to generate the control current based on the first power supply voltage, in response to the control signal; and a third transistor configured to provide the control current to the first output node in response to a bias signal.

10. The circuit of claim 9, wherein the control circuit is further configured, during the first operation period or the second operation period, when the ramp signal starts to ramp down, to output the control current to the current source through the first output node.

11. A circuit, comprising:

a first amplifier configured to operate based on a first power supply voltage and to generate a first output signal by equalizing voltage levels of input nodes and output nodes in response to a first auto-zero signal in a first auto-zero period, comparing a ramp signal and a reset signal of a pixel signal output from a pixel array in a first operation period, and comparing the ramp signal and an image signal of the pixel signal output from the pixel array in a second operation period;

a second amplifier configured to operate based on the first power supply voltage, to charge a capacitor in response to a second auto-zero signal in a second auto-zero period, and to generate a second output signal based on the first output signal; and a counter configured to operate based on a second power supply voltage, to count pulses of the second output signal, and to output a counting result as a digital signal, wherein a first level of the first power supply voltage is greater than a second level of the second power supply voltage, wherein the second amplifier is further configured to adjust a voltage level of the second output signal from a low level to a third level, wherein the third level is less than or equal to the second level of the second power supply voltage, wherein, during at least one of the first operation period and the second operation period, the second output signal controls a power current of the second amplifier, and wherein an operation of the second amplifier is stopped from a first time at which the second auto-zero period ends to a second time at which the first operation period starts.

12. The circuit of claim 11, wherein the second amplifier includes:

a first transistor configured to provide the first power supply voltage to a first output node, from which the second output signal is output, in response to the first output signal;

a clipping circuit coupled between a power supply voltage terminal and the first transistor, and configured to adjust the voltage level of the second output signal by causing a voltage drop between the power supply voltage terminal and the first transistor;

a second transistor coupled with the capacitor through a bias node, and configured to be turned on in response to the second auto-zero signal;

a third transistor configured to be turned off in response to a power down signal such that the operation of the second amplifier is stopped;

a current source coupled with the first transistor through the first output node, coupled with the capacitor and the second transistor through the bias node, and configured to generate the power current based on a voltage level of the bias node, which is maintained by the capacitor;

a feedback circuit coupled with the clipping circuit, and configured to receive a signal, which is based on the second output signal, and to output a feedback signal for controlling the power current; and a fourth transistor coupled with the current source through a second output node, and configured to connect the first output node and the second output node in response to the feedback signal.

13. The circuit of claim 12, wherein the clipping circuit includes a fifth transistor and a sixth transistor, wherein a drain terminal of the fifth transistor is coupled to a gate terminal of the fifth transistor, and wherein a drain terminal of the sixth transistor is coupled to a gate terminal of the sixth transistor.

14. The circuit of claim 13, wherein the feedback circuit includes:

a logic gate coupled with a third output node between the fifth transistor and the sixth transistor, and configured to output the feedback signal based on a voltage level of the third output node and a feedback enable signal, and wherein the fourth transistor is turned off in response to the feedback signal.

15. The circuit of claim 14, wherein the logic gate includes a NAND gate.

16. The circuit of claim 12, wherein the power down signal is activated when the second auto-zero period ends and is deactivated when the first operation period starts.

17. A circuit which operates a first power supply voltage and generates an output signal in an operation period, comprising:

a first transistor configured to provide a power supply voltage to a first output node from which the output signal is output;

a clipping circuit coupled between a power supply voltage terminal and the first transistor, and configured to adjust a voltage level of the output signal to be lower than a level of the first power supply voltage, by making a voltage drop between the power supply voltage terminal and the first transistor; and a current source coupled with the first transistor through the first output node, and configured to generate a power current.

18. The circuit of claim 17, wherein the clipping circuit includes a second transistor and a third transistor, wherein a drain terminal of the second transistor is coupled to a gate terminal of the second transistor, and wherein a drain terminal of the third transistor is coupled to a gate terminal of the third transistor.

19. The circuit of claim 18, wherein the first transistor is a positive metal-oxide semiconductor (PMOS) transistor, and the second transistor and the third transistor are negative metal-oxide semiconductor (NMOS) transistors.

20. The circuit of claim 18, wherein the first transistor, the second transistor, and the third transistor are positive metal-oxide semiconductor (PMOS) transistors.

* * * * *